United States Patent
Song

(10) Patent No.: US 11,468,924 B2
(45) Date of Patent: Oct. 11, 2022

(54) MEMORY DEVICES OPERATING AT HIGH SPEED AND MEMORY SYSTEMS WITH THE MEMORY DEVICES OPERATING AT HIGH SPEED

(71) Applicant: SK hynix Inc., Icheon-si (KR)

(72) Inventor: Choung Ki Song, Yongin-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 17/151,496

(22) Filed: Jan. 18, 2021

(65) Prior Publication Data
US 2021/0390989 A1    Dec. 16, 2021

(30) Foreign Application Priority Data
Jun. 15, 2020    (KR) .................. 10-2020-0072577

(51) Int. Cl.
  *G11C 7/00*    (2006.01)
  *G11C 7/10*    (2006.01)
  *G11C 7/06*    (2006.01)

(52) U.S. Cl.
  CPC ............. *G11C 7/1039* (2013.01); *G11C 7/06* (2013.01); *G11C 7/1057* (2013.01); *G11C 7/1084* (2013.01)

(58) Field of Classification Search
  CPC .................................................. G11C 7/1039
  USPC ..................................................... 365/189.11
  See application file for complete search history.

(56) References Cited

U.S. PATENT DOCUMENTS

| | | | | |
|---|---|---|---|---|
| 5,530,955 A | * | 6/1996 | Kaneko | G06F 12/08 711/147 |
| 6,338,108 B1 | * | 1/2002 | Motomura | G06F 13/4243 710/110 |
| 2015/0302904 A1 | * | 10/2015 | Yoon | G11C 7/1072 711/105 |

FOREIGN PATENT DOCUMENTS

| KR | 1020100076657 A | 7/2010 |
|---|---|---|
| KR | 1020170030900 A | 3/2017 |
| KR | 1020170075359 A | 7/2017 |

* cited by examiner

*Primary Examiner* — Hoai V Ho
(74) *Attorney, Agent, or Firm* — William Park & Associates Ltd.

(57) ABSTRACT

A memory device includes a memory area configured to store data, a data input/output (I/O) part configured to receive and output data through an external bus, an I/O buffering part coupled between the memory area and the data I/O part to store data outputted from the memory area, and a first internal data transmission line providing a data transmission path between the memory area and the I/O buffering part and having a first bandwidth which is greater than a bandwidth of the external bus, Data transmission between the memory area and the I/O buffering part through the first internal data transmission line is executed using a portion of the first bandwidth in a first operation mode and is executed using all of the first bandwidth in a second operation mode.

10 Claims, 27 Drawing Sheets

MEMORY DEVICES OPERATING AT HIGH SPEED AND MEMORY SYSTEMS WITH THE MEMORY DEVICES OPERATING AT HIGH SPEED

CROSS-REFERENCE TO RELATED APPLICATION

The present application claims priority under 35 U.S.C. 119(a) to Korean Application No. 10-2020-0072577, filed on Jun. 15, 2020, which is incorporated herein by reference in its entirety.

BACKGROUND

1. Technical Field

Various embodiments of the present teachings relate to memory devices and memory systems, and more particularly, to memory devices operating at a high speed and memory systems with the memory devices.

2. Related Art

Fast memory systems, which are capable of transmitting data at a high speed, well-matched with fast central processing units (CPUs) have been increasingly in demand with the development of high performance computing systems. Thus, a lot of effort has been focused on improving bandwidth for memory devices. In general, memory devices such as dynamic random access memory (DRAM) devices are designed to have an internal bandwidth and an external bandwidth which are consistent with each other. Increasing the external bandwidth of the memory devices may be restricted due to a limitation of data input/output, and increasing the internal bandwidth of the memory devices may also be restricted due to a limitation of internal data transmission speed.

SUMMARY

According to an embodiment, a memory device includes a memory area configured to store data, a data input/output (I/O) part configured to receive and output data through an external bus, an I/O buffering part coupled between the memory area and the data I/O part to store data outputted from the memory area, and a first internal data transmission line providing a data transmission path between the memory area and the I/O buffering part and having a first bandwidth which is greater than a bandwidth of the external bus. Data transmission between the memory area and the I/O buffering part through the first internal data transmission line is executed using a portion of the first bandwidth in a first operation mode and is executed using all of the first bandwidth in a second operation mode.

According to another embodiment, a memory device includes a plurality of banks, a data input/output (I/O) part configured to receive and output data through an external bus, a global data transmission line disposed between the data I/O part and the plurality of banks to provide a data transmission path, an I/O buffering part configured to store data outputted from the plurality of banks through the global data transmission line, and a first internal data transmission line configured to provide a data transmission path between the global data transmission line and the I/O buffering part. Data transmission between the global data transmission line and each of the plurality of banks is executed using a first bandwidth which is the same as a bandwidth of the external bus, and the first internal data transmission line has a second bandwidth equal to a the first bandwidth multiplied by the number of the banks.

According to yet another embodiment, a memory system includes a memory device and a memory controller. The memory device includes a memory area configured to store data and an input/output (I/O) buffering part configured to store data outputted from the memory area. The memory controller is configured to control read operations of the memory device. The memory device is configured to store data of all columns in a selected row designated by a row address among a plurality of rows in the memory area into the I/O buffering part in response to an external command outputted from the memory controller and is configured to output data of a selected column designated by a column address among the data stored in the I/O buffering part, and the memory controller is configured to perform a scheduling operation for successively executing read request commands having the same row address among a plurality of read request commands for performing read operations of the memory device.

According to still another embodiment, a memory system includes a memory device and a memory controller. The memory device includes a plurality of banks and an input/output (I/O) buffering part configured to store data outputted from the plurality of banks. The memory controller is configured to control read operations of the memory device. The memory device is configured to store data of selected columns designated by a column address in selected rows designated by a row address among a plurality of rows in all of the banks into the I/O buffering part in response to an external command outputted from the memory controller and is configured to output data of a selected bank designated by a bank address among the data stored in the I/O buffering part, and the memory controller is configured to perform a scheduling operation for successively executing read request commands having the same row address and the same column address among a plurality of read request commands for performing read operations of the memory device.

BRIEF DESCRIPTION OF DRAWINGS

Certain features of the disclosed technology are illustrated in various embodiments with reference to the attached drawings, in which.

DETAILED DESCRIPTION

In the following description of embodiments, it will be understood that the terms "first" and "second" are intended to identify particular elements. The terms are not used to imply a sequence or number of elements. In addition, when an element is referred to as being located "on," "over," "above," "under," or "beneath" another element, it is intended to mean a relative positional relationship, but not used to limit certain cases in which the element directly contacts the other element, or at least one intervening element is present therebetween. Accordingly, the terms such as "on," "over," "above," "under," "beneath," "below," and the like are used herein for the purpose of describing particular embodiments only and are not intended to limit the scope of the present disclosure. Further, when an element is referred to as being "connected" or "coupled" to another element, the elements may be electrically or mechanically connected to each other either directly or through an intermediary element.

Various embodiments are directed to memory devices and memory systems including the memory devices.

The present disclosure is described hereinafter in detail with reference to presented embodiments. Although the presented embodiments are described in conjunction with DRAM devices, it will be apparent that the present disclosure is not limited to the DRAM devices. For example, the present disclosure is equally applicable to all static random access memory (SRAM) devices, synchronous dynamic random access memory (SDRAM) devices, double data rate synchronous dynamic random access memory (DDR SDRAM, DDR2 SDRAM, DDR3 SDRAM, and the like) devices, graphic double data rate synchronous dynamic random access memory (GDDR SDRAM, GDDR2 SDRAM, GDDR3 SDRAM, and the like) devices, quad data rate dynamic random access memory (QDR DRAM) devices, extreme data rate dynamic random access memory (XDR DRAM) devices, fast page mode dynamic random access memory (FPM DRAM) devices, video dynamic random access memory (VDRAM) devices, extended data output dynamic random access memory (EDO DRAM) devices, burst extended data output dynamic random access memory (BEDO DRAM) devices, multibank dynamic random access memory (MDRAM) devices, synchronous graphic random access memory (SGRAM) devices, and/or other type DRAM devices.

Figure 1:
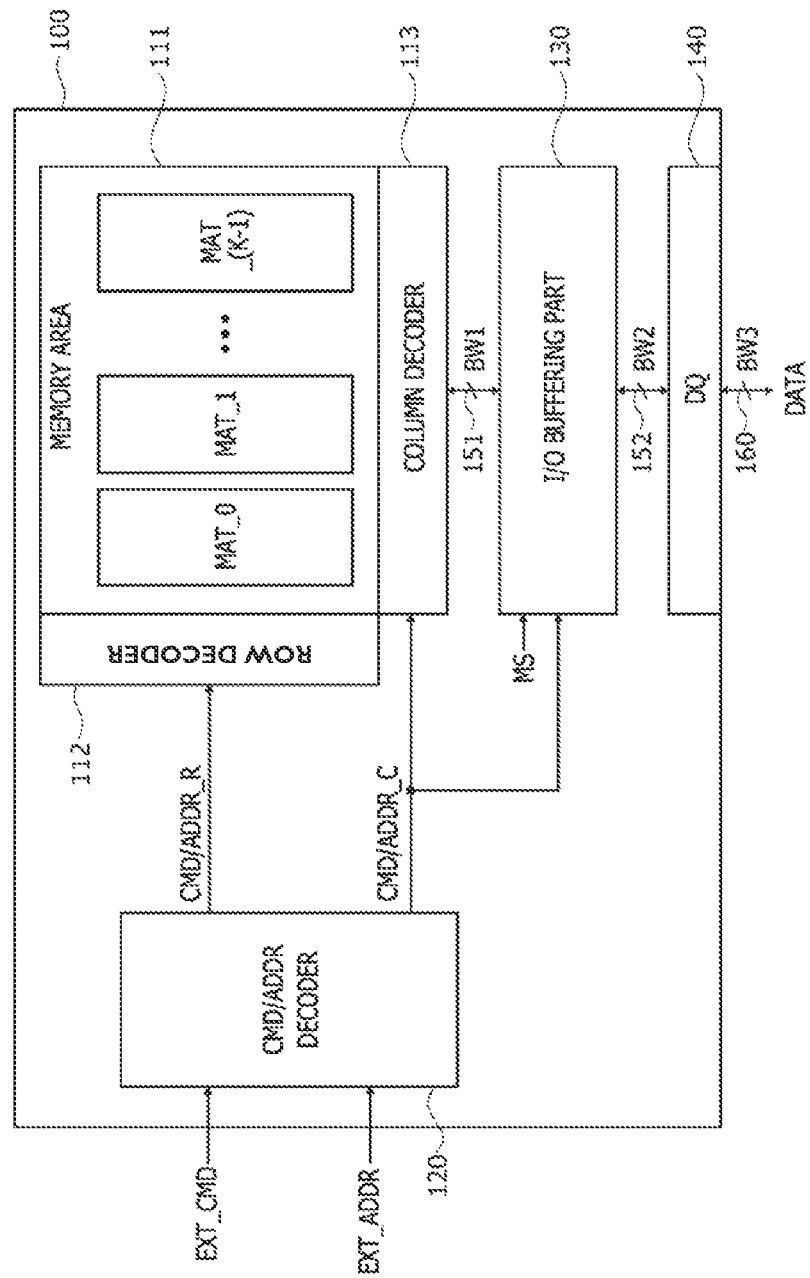
FIG. 1 is a block diagram illustrating a configuration of a memory device according to an embodiment of the present disclosure.
Figure 2:
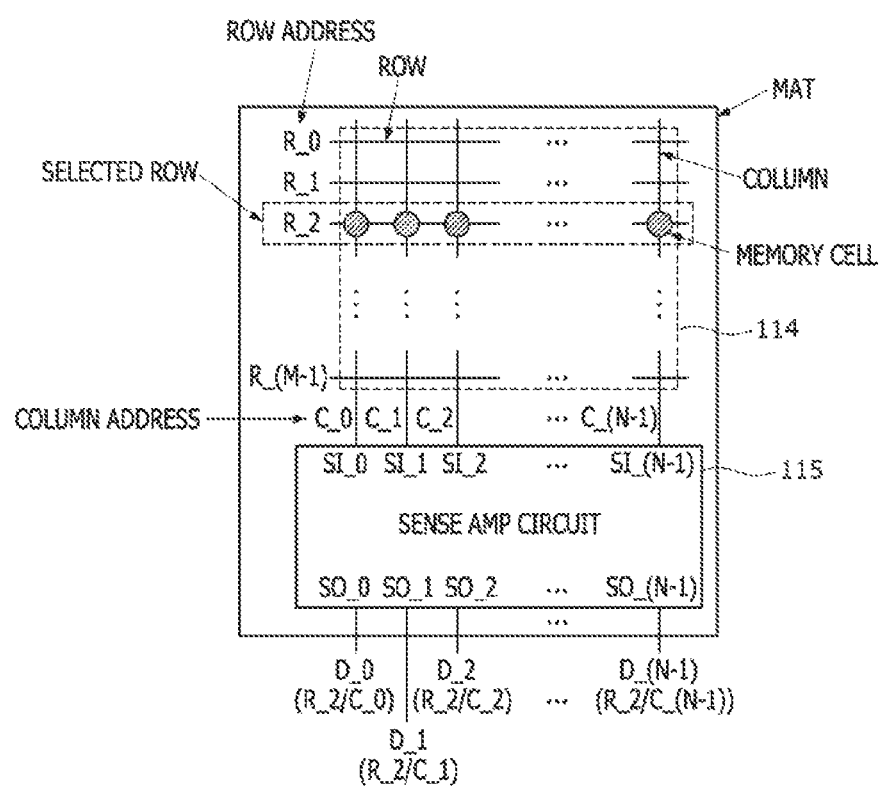
FIG. 2 illustrates an example of a matrix included in a memory area of the memory device illustrated in FIG. 1.

FIG. 1 is a block diagram illustrating a configuration of a memory device 100 according to an embodiment of the present disclosure, and FIG. 2 illustrates a matrix included in a memory area 111 of the memory device 100 illustrated in FIG. 1. First, referring to FIG. 1, the memory device 100 may include the memory area 111, a row decoder 112, a column decoder 113, a command/address decoder 120, an I/O buffering part 130, and a data I/O part 140. In an embodiment, the memory area 111 may be a bank including a plurality of matrices, for example, first to $K^{th}$ matrices MAT_0, MAT_1, . . . , and MAT_(K−1). A disposal structure of the first to $K^{th}$ matrices MAT_0, MAT_1, . . . , and MAT_(K−1) in the memory area 111 may be set to be different according to the embodiments.

As illustrated in FIG. 2, each matrix MAT may include a memory cell array 114 and a sense/amplification circuit 115. The structure of the matrix MAT illustrated in FIG. 2 may be equally applicable to each of the first to $K^{th}$ matrices MAT_0, MAT_1, . . . , and MAT_(K−1). The memory cell array 114 may have a structure in which a plurality of memory cells are respectively disposed at cross points of a plurality of rows and a plurality of columns. In an embodiment, when the plurality of rows include "M"-number of rows and the plurality of columns include "N"-number of columns (where, "M" denotes a natural number which is equal to or greater than two, and "N" denotes a natural number which is equal to or greater than two), "M×N"-number of memory cells may be arrayed in the matrix MAT. In such a case, "N"-number of memory cells may be arrayed in each of the "M"-number of rows, and each of the "M"-number of rows may be selected by one of row addresses R_0, R_1, R_2, . . . , and R_(M−1). Similarly, "M"-number of memory cells may be arrayed in each of the "N"-number of columns, and each of the "N"-number of columns may be selected by one of column addresses C_0, C_1, C_2, . . . , and C_(N−1). Thus, one of the memory cells disposed in the memory cell array 114 may be selected by one row address and one column address. Hereinafter, a row selected by the row address may be referred to as a selected row, and a column selected by the column address may be referred to as a selected column.

The sense/amplification circuit 115 may have input lines SI_0, SI_1, . . . , and SI_(N−1) corresponding to respective columns of the columns C_0, C_1, C_2, . . . , and C_(N−1) and output lines SO_0, SO_1, . . . , and SO_(N−1) corresponding to respective input lines of the input lines SI_0, SI_1, . . . , and SI_(N−1). Data of the memory cells arrayed in one selected row may be transmitted to the input lines SI_0, SI_1, . . . , and SI_(N−1), respectively. For example, a datum of the memory cell located in the first column C_0 of the selected row may be transmitted through the first input line SI_0, and a datum of the memory cell located in the second column C_1 of the selected row may be transmitted through the second input line SI_1. In the same way, a datum of the memory cell located in the $N^{th}$ column C_(N−1) of the selected row may be transmitted through the $N^{th}$ input line SI_(N−1). In an embodiment, a datum of each memory cell may have a logic "high" level corresponding to a binary number of "1" or a logic "low" level corresponding to a binary number of "0".

The sense/amplification circuit 115 may perform an amplifying operation for data loaded on the first to $N^{th}$ input lines SI_0, SI_1, . . . , and SI_(N−1) and may output the amplified data through the first to $N^{th}$ output lines SO_0, SO_1, . . . , and SO_(N−1). Although the data outputted through the first to $N^{th}$ output lines SO_0, SO_1, . . . , and SO_(N−1) correspond to amplified data of the data loaded on the first to $N^{th}$ input lines SI_0, SI_1, . . . , and SI_(N−1), the data outputted through the first to $N^{th}$ output lines SO_0, SO_1, . . . , and SO_(N−1) may be referred to as "data" hereinafter without adding a term "amplified" for the purpose of ease and convenience in explanation. The output lines SO_0, SO_1, . . . , and SO_(N−1) may correspond to the input lines SI_0, SI_1, . . . , and SI_(N−1), respectively. For example, the first output line SO_0 may correspond to the first input line SI_0. Thus, the data inputted through the first input line SI_0 may be outputted through the first output line SO_0. Similarly, the data inputted through the $N^{th}$ input line SI_(N−1) may be outputted through the $N^{th}$ output line SO_(N−1). In the present embodiment, it may be assumed that the third row is designated as a selected row by the row address "R_2". In such a case, a datum D0 outputted through the first output line SO_0 may correspond to a datum of a memory cell selected by the row address "R_2" and the column address "C_0". In addition, a datum D1 outputted through the second output line SO_1 may correspond to a datum of a memory cell selected by the row address "R_2" and the column address "C_1". The same way as described above may be applied to each of the remaining output lines SO_2, SO_3, . . . , and SO_(N−1).

The number of bits included in the data outputted through the sense/amplification circuit 115 may be different according to an operation mode of the memory device 100. The memory device 100 may operate in a first operation mode or a second operation mode. Hereinafter, the first operation mode may be defined as a normal speed operation mode, and the second operation mode may be defined as a high speed operation mode. It may be understood that the normal speed operation mode corresponds to a general operation mode of a memory device such as a DRAM device. In contrast, it may be understood that the high speed operation mode corresponds to an operation mode in which the memory device operates at a high speed faster than an operation speed of the memory device operating at the normal speed operation mode.

In the first operation mode, the sense/amplification circuit 115 may output only data loaded on any one of the output lines SO_0, SO_1, SO_2, . . . , and SO_(N−1) which is selected by the column address. That is, data may be outputted only through one output line among the "N"-number of output lines SO_0, . . . , and SO_(N−1) in the first operation mode. Thus, in the first operation mode, one-bit data may be outputted from the sense/amplification circuit 115. In contrast, in the second operation mode, the sense/amplification circuit 115 may amplify all of data loaded on the first to $N^{th}$ input lines SI_0, SI_1, SI_2, . . . , and SI_(N−1) of the selected row to output the amplified data through all of the first to $N^{th}$ output lines SO_0, SO_1, SO_2, . . . , and SO_(N−1). Thus, in the second operation mode, "N"-bit data may be outputted from the sense/amplification circuit 115. In an embodiment, the "N"-bit data loaded on the first to $N^{th}$ output lines SO_0, SO_1, SO_2, . . . , and SO_(N−1) may be outputted in parallel from the sense/amplification circuit 115 in the second operation mode.

Referring gain to FIG. 1, the row decoder 112 may receive a command CMD and a row address ADDR_R and may activate a row (i.e., a selected row) which is designated by the row address ADDR_R. An operation for designating the selected row based on the row address ADDR_R may be equally executed in both of the first and second operation modes. The column decoder 113 may receive the command CMD and a column address ADDR_C and may activate a column (i.e., a selected column) which is designated by the column address ADDR_C. In the second operation mode, the column decoder 113 may receive the command CMD without the column address ADDR_C. As described with reference to FIG. 2, in the second operation mode, the data loaded on all of the columns of the selected row may be outputted from each of a plurality of matrices (i.e., first to $K^{th}$ matrices MAT_0, MAT_1, . . . , and MAT_(K−1)) constituting the memory area 111. That is, in the second operation mode, it may be unnecessary to designate a column (i.e., a selected column) based on the column address ADDR_C in each of the first to $K^{th}$ matrices MAT_0, MAT_1, . . . , and MAT_(K−1). Thus, the column decoder 113 does not execute an operation for designating the selected column based on the column address ADDR_C.

The command/address decoder 120 may receive an external command EXT_CMD and an external address EXT_ADDR from an external device, for example, a memory controller. The command/address decoder 120 may decode the external command EXT_CMD to generate and output the command CMD. In addition, the command/address decoder 120 may decode the external address EXT_ADDR to generate and output the row address ADDR_R and the column address ADDR_C. A portion of the command CMD outputted from the command/address decoder 120 may be inputted to the row decoder 112 regardless of the operation mode. In contrast, the portion of the command CMD outputted from the command/address decoder 120 may be inputted to the column decoder 113 in a different form according to the operation mode.

The row address ADDR_R outputted from the command/address decoder 120 may be inputted to the row decoder 112 regardless of the operation mode. In the first operation mode, the column address ADDR_C outputted from the command/address decoder 120 may be inputted to the column decoder 113. In contrast, in the second operation mode, the column address ADDR_C outputted from the command/address decoder 120 does not inputted to the column decoder 113. In the second operation mode, the column address ADDR_C outputted from the command/address decoder 120 may be inputted to the I/O buffering part 130 instead of the column decoder 113. The selective input operation of the column address ADDR_C will be described more fully hereinafter.

In an embodiment, the command/address decoder 120 may output an active command ACT, a read command RD, a pre-charge command PRE, the row address ADDR_R, and the column address ADDR_C in order to perform a read operation of the memory device 100. First, the command/address decoder 120 may transmit the active command ACT and the row address ADDR_R to the row decoder 112. A selected row designated by the row address ADDR_R among the rows of the memory cell array 114 included in the memory device 100 may be activated by the active command ACT. Next, the command/address decoder 120 may transmit the read command RD and the column address ADDR_C to the column decoder 113 or may transmit only the read command RD without the column address ADDR_C to the column decoder 113. Specifically, in the first operation mode, the command/address decoder 120 may transmit the read command RD and the column address ADDR_C to the column decoder 113. In such a case, the column decoder 113 may transmit the column address ADDR_C to the sense/amplification circuit (115 of FIG. 2) such that only a datum loaded on a selected column among columns in the selected row is outputted from the sense/amplification circuit (115 of FIG. 2). In the second operation mode, the command/address decoder 120 may transmit only the read command RD to the column decoder 113. In such a case, the column decoder 113 may operate such that data loaded on all of the columns in the selected row are outputted from the sense/amplification circuit (115 of FIG. 2). Subsequently, the command/address decoder 120 may transmit the pre-charge command PRE and the row address ADDR_R to the row decoder 112. The selected row designated by the row address ADDR_R of the memory device 100 may be pre-charged in response to the pre-charge command PRE.

The I/O buffering part 130 may be configured to store data outputted from the memory area 111. An amount of the data stored in the I/O buffering part 130 may be different according to the operation mode of the memory device 100. Specifically, in the first operation mode, the I/O buffering part 130 may store a datum of a memory cell located at a cross point of the selected row and the selected column which are designated by the row address ADDR_R and the column address ADDR_C. In the first operation mode, an amount of data stored in the I/O buffering part 130 may correspond to the number of columns selected by column address ADDR_C. In contrast, in the second operation mode, the I/O buffering part 130 may store data loaded on all of the columns in the selected row designated by the row address ADDR_R. That is, in the second operation mode, data of all of memory cells arrayed in the selected row designated by the row address ADDR_R are stored into the I/O buffering part 130 without executing an operation for selecting at least one column in the selected row using the column address ADDR_C. In the second operation mode, an amount of data stored into the I/O buffering part 130 at once may correspond to the number of columns (or the number of memory cells) sharing one row with each other. A mode selection control signal MS may be inputted to the I/O buffering part 130 to select one of the first and second operation modes.

Figure 3:
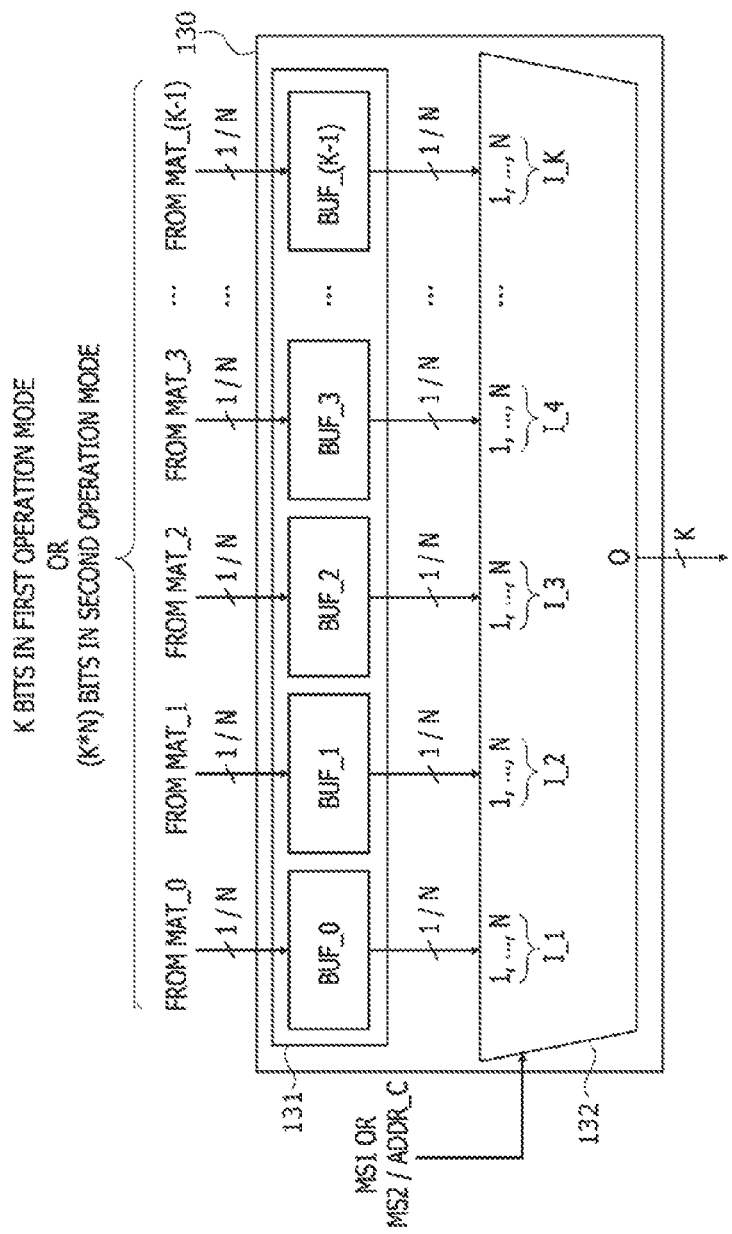
FIG. 3 is a block diagram illustrating an example of an input/output (I/O) buffering part included in the memory device illustrated in FIG. 1.

FIG. 3 is a block diagram illustrating an example of the I/O buffering part 130 included in the memory device 100 illustrated in FIG. 1. Referring to FIGS. 1 and 3, the I/O buffering part 130 may include a buffer memory part 131 and a selection/output part 132. The buffer memory part 131 may be configured to store data outputted from the memory area 111. In an embodiment, data outputted from the memory area 111 may be transmitted to the buffer memory part 131 in parallel. In the present embodiment, it may be assumed that all of the matrices MAT_0, . . . , and MAT_(K−1) have the same configuration and all of the selected rows designated by various row addresses have the same number of columns. In such a case, the data transmission between the buffer memory part 131 and the memory area 111 may be executed through a first internal data transmission line 151 having a data transmission bandwidth BW1 of "K×N" bits (where, "K" denotes the number of the matrices, and "N" denotes the number of bits included in the data belonging to each selected row). An amount of data transmitted to the I/O buffering part 130 through the first internal data transmission line 151 may be different according to the operation mode. Specifically, in the first operation mode, the buffer memory part 131 may receive "K"-bit data from the memory area 111 through the first internal data transmission line 151. In such a case, some (i.e., only "K" bits) of "K×N" bits constituting the data transmission bandwidth BW1 may contribute to the data transmission between the buffer memory part 131 and the memory area 111. In contrast, in the second operation mode, the buffer memory part 131 may receive "K×N"-bit data from the memory area 111 through the first internal data transmission line 151. In such a case, all of "K×N" bits constituting the data transmission bandwidth BW1 may contribute to the data transmission between the buffer memory part 131 and the memory area 111.

In an embodiment, the buffer memory part 131 may include a plurality of buffer memories, for example, first to $K^{th}$ buffer memories BUF_0, . . . , and BUF_(K−1). The number of the first to $K^{th}$ buffer memories BUF_0, . . . , and BUF_(K−1) may be equal to the number of the first to $K^{th}$ matrices MAT_0, MAT_1, . . . , and MAT_(K−1). In such a case, the first to $K^{th}$ buffer memories BUF_0, . . . , and BUF_(K−1) may store data outputted from the first to $K^{th}$ matrices MAT_0, MAT_1, . . . , and MAT_(K−1), respectively. For example, the first buffer memory BUF_0 may be configured to store the data outputted from the first matrix MAT_0, and the second buffer memory BUF_1 may be configured to store the data outputted from the second matrix MAT_1. In the same way, the $K^{th}$ buffer memory BUF_(K−1) may be configured to store the data outputted from the $K^{th}$ matrix MAT_(K−1).

In the first operation mode, the first buffer memory BUF_0 may store 1-bit data outputted from the first matrix MAT_0, and the second buffer memory BUF_1 may store 1-bit data outputted from the second matrix MAT_1. In the same way, the $K^{th}$ buffer memory BUF_(K−1) may store 1-bit data outputted from the $K^{th}$ matrix MAT_(K−1). Thus, in the first operation mode, "K"-bit data may be stored into the first to $K^{th}$ buffer memories BUF_0, . . . , and BUF_(K−1). In the second operation mode, the first buffer memory BUF_0 may store "N"-bit data outputted from the first matrix MAT_0, and the second buffer memory BUF_1 may store "N"-bit data outputted from the second matrix MAT_1. In the same way, the $K^{th}$ buffer memory BUF_(K−1) may store "N"-bit data outputted from the $K^{th}$ matrix MAT_(K−1). Thus, in the second operation mode, "K×N"-bit data may be stored into the first to $K^{th}$ buffer memories BUF_0, . . . , and BUF_(K−1). In the second operation mode, the data outputted from the matrices MAT_0, MAT_1, . . . , and MAT_(K−1) may be transmitted to the buffer memories BUF_0, . . . , and BUF_(K−1) in parallel.

An output portion of the buffer memory part 131 may have the same configuration as an input portion of the buffer memory part 131. That is, "K"-bit data may be outputted form the buffer memory part 131 in the first operation mode, and "K×N"-bit data may be outputted form the buffer memory part 131 in the second operation mode. Specifically, in the first operation mode, the first buffer memory BUF_0 may store and output 1-bit data which is outputted from the first matrix MAT_0, and the second buffer memory BUF_1 may store and output 1-bit data which is outputted from the second matrix MAT_1. In the same way, the $K^{th}$ buffer memory BUF_(K−1) may store and output 1-bit data which is outputted from the $K^{th}$ matrix MAT_(K−1). In the second operation mode, the first buffer memory BUF_0 may store and output "N"-bit data which are outputted from the first matrix MAT_0, and the second buffer memory BUF_1 may store and output "N"-bit data which are outputted from the second matrix MAT_1. In the same way, the $K^{th}$ buffer memory BUF_(K−1) may store and output "N"-bit data which are outputted from the $K^{th}$ matrix MAT_(K−1).

"K"-bit data or "K×N"-bit data outputted from the buffer memory part 131 may be inputted to input terminals of the selection/output part 132. Specifically, data outputted from the first buffer memory BUF_0 may be inputted to a first input terminal I_1 of the selection/output part 132. In the first operation mode, because 1-bit data is outputted from the first buffer memory BUF_0, the first input terminal I_1 of the selection/output part 132 may receive the 1-bit datum. In the second operation mode, because "N"-bit data are outputted from the first buffer memory BUF_0, the first input terminal I_1 of the selection/output part 132 may receive the "N"-bit data. In an embodiment, data outputted from the first buffer memory BUF_0 may be transmitted to the first input terminal I_1 of the selection/output part 132 in parallel in the second operation mode. Similarly, in the second operation mode, data outputted from each of the remaining buffer memories (i.e., the second to $K^{th}$ buffer memories BUF_1, . . . , and BUF_(K−1)) may also be transmitted in parallel to any one of second to $K^{th}$ input terminals I_2, . . . , and I_K of the selection/output part 132.

The mode selection control signal MS may include a first mode selection control signal MS1 and a second mode selection control signal MS2. In the first operation mode, the first mode selection control signal MS1 may be inputted to a control terminal of the selection/output part 132. In the second operation mode, the second mode selection control signal MS2 and the column address ADDR_C may be inputted to the control terminal of the selection/output part 132. When the first mode selection control signal MS1 is inputted to the selection/output part 132, the selection/output part 132 may sequentially output all of data (i.e., "K"-bit data), which are inputted to respective input terminals of the first to $K^{th}$ input terminals I_1, . . . , and I_K, through an output terminal O of the selection/output part 132. As a result, "K"-bit data may be outputted in series through the output terminal O of the selection/output part 132. In contrast, when the second mode selection control signal MS2 is inputted to the selection/output part 132, the selection/output part 132 may sequentially output data of sub-input terminals, which are selected by the column address ADDR_C from respective input terminals of the first to $K^{th}$ input terminals I_1, . . . , and I_K, through an output terminal O of the selection/output part 132. Each of the first to $K^{th}$ input terminals I_1 may include "N"-number of sub-input terminals 1, . . . , and N. For example, a datum inputted to a sub-input terminal selected by the column address ADDR_C among the first to $N^{th}$ sub-input terminals included in the first input terminal I_1 receiving "N"-bit data outputted from a selected row of the first matrix MAT_0 may be outputted through the output terminal O. Next, a datum inputted to a sub-input terminal selected by the column address ADDR_C among the first to $N^{th}$ sub-input terminals included in the second input terminal I_2 receiving "N"-bit data outputted from a selected row of the second matrix MAT_1 may be outputted through the output terminal O. This sequential data output may be executed until a datum inputted to the $K^{th}$ input terminal I_K is outputted. Accordingly, even in the second operation mode, "K"-bit data may be sequentially outputted in series through the output terminal O of the selection/output part 132.

Referring again to FIG. 1, the data I/O part 140 of the memory device 100 may receive data DATA from an external device through an external bus 160 or may output the data DATA to an external device through the external bus 160. The data I/O part 140 may be designed to include a plurality of data I/O terminals, the number of which corresponds to a data transmission bandwidth BW3 of the external bus 160. The data I/O part 140 may be coupled to the I/O buffering part 130 through a second internal data transmission line 152. In an embodiment, the second internal data transmission line 152 may have a data transmission bandwidth BW2 including the same number of bits as data which are transmitted from the memory area 111 to the I/O buffering part 130. The data I/O part 140 may receive data from the I/O buffering part 130 through the second internal data transmission line 152. The data I/O part 140 may output the data, which are received from the I/O buffering part 130, to an external device such as a memory controller through the external bus 160. The data transmission bandwidth BW3 of the external bus 160 may be narrower than the data transmission bandwidth BW1 of the first internal data transmission line 151. In an embodiment, the data transmission bandwidth BW3 of the external bus 160 may be equal to the data transmission bandwidth BW1 of the first internal data transmission line 151. In an embodiment, the data transmission bandwidth BW3 of the external bus 160 may be equal to the data transmission bandwidth BW2 of the second internal data transmission line 152.

Figure 4:
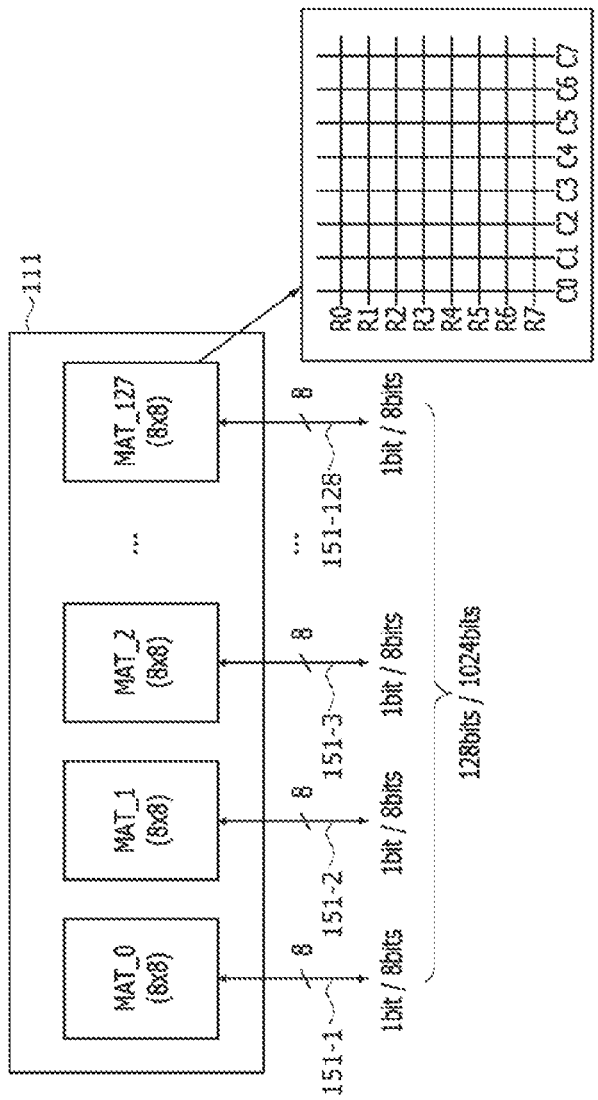
FIG. 4 illustrates the number of bits included in read data outputted from a memory area in a first operation mode and a second operation mode of a memory device according to an embodiment of the present disclosure.
Figure 5:
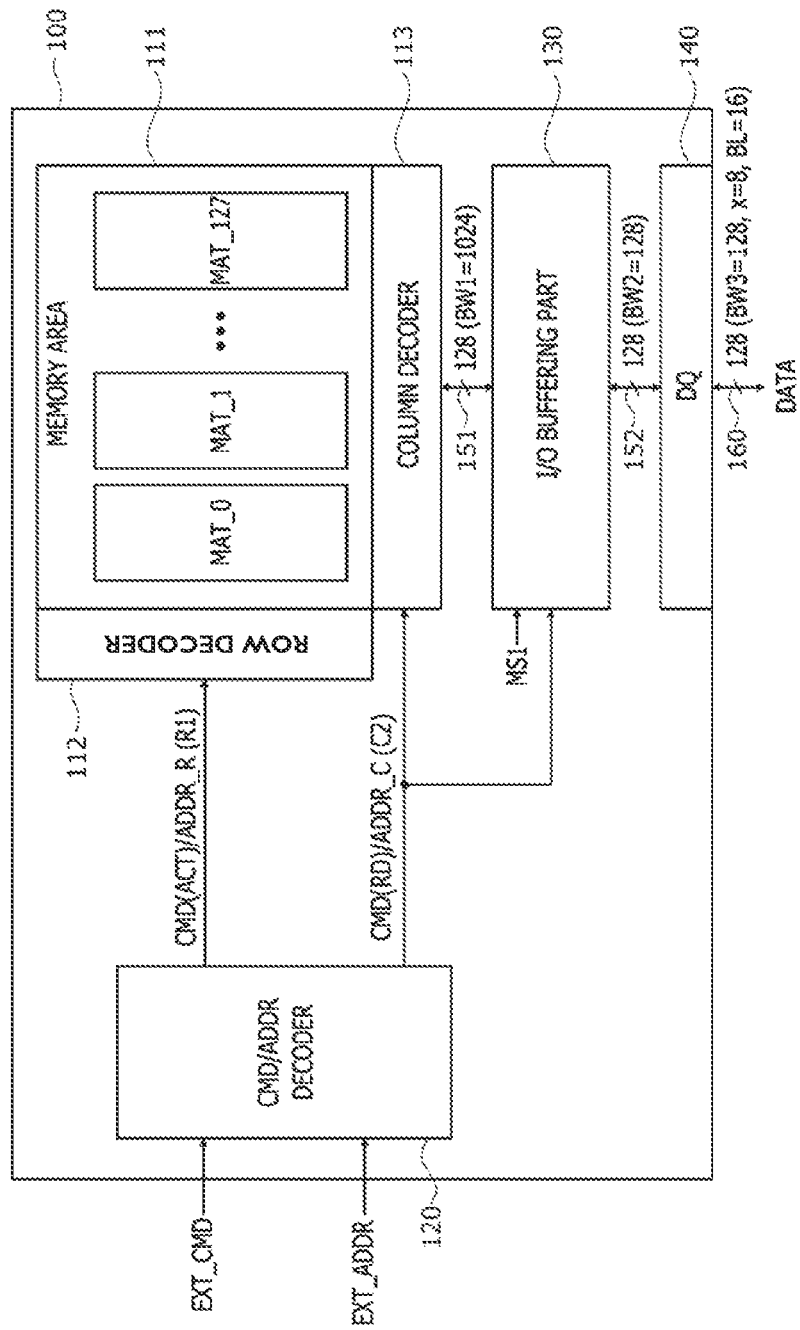
FIG. 5 is a block diagram illustrating a read operation in a first operation mode of a memory device according to an embodiment of the present disclosure.
Figure 6:
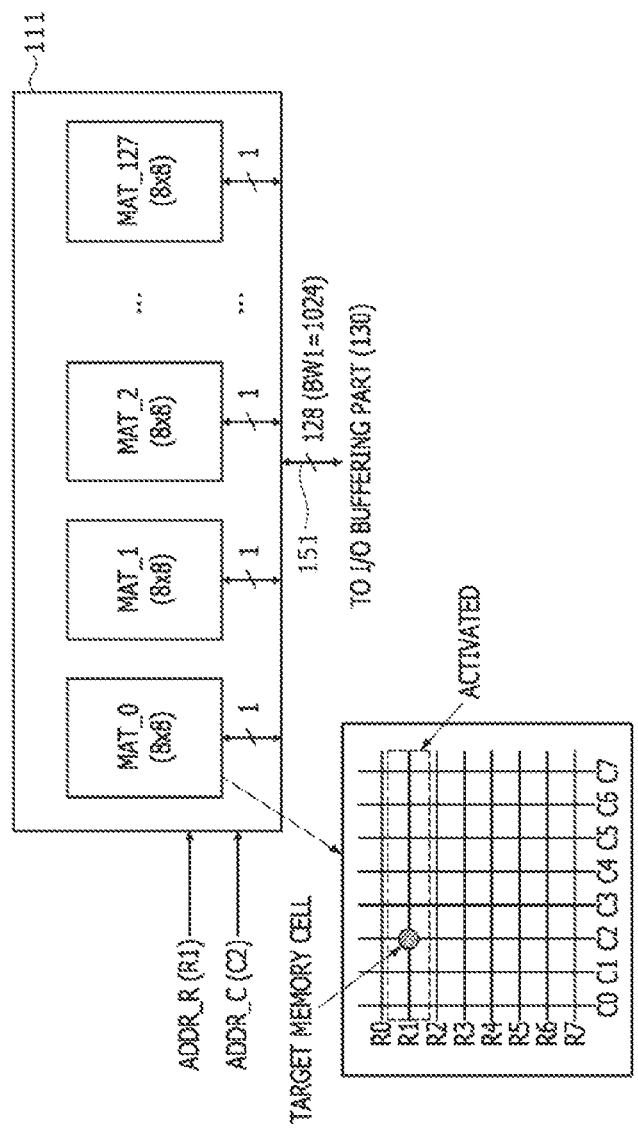
FIG. 6 illustrates the number of bits included in read data outputted from a memory area in a first operation mode of a memory device according to an embodiment of the present disclosure.
Figure 7:
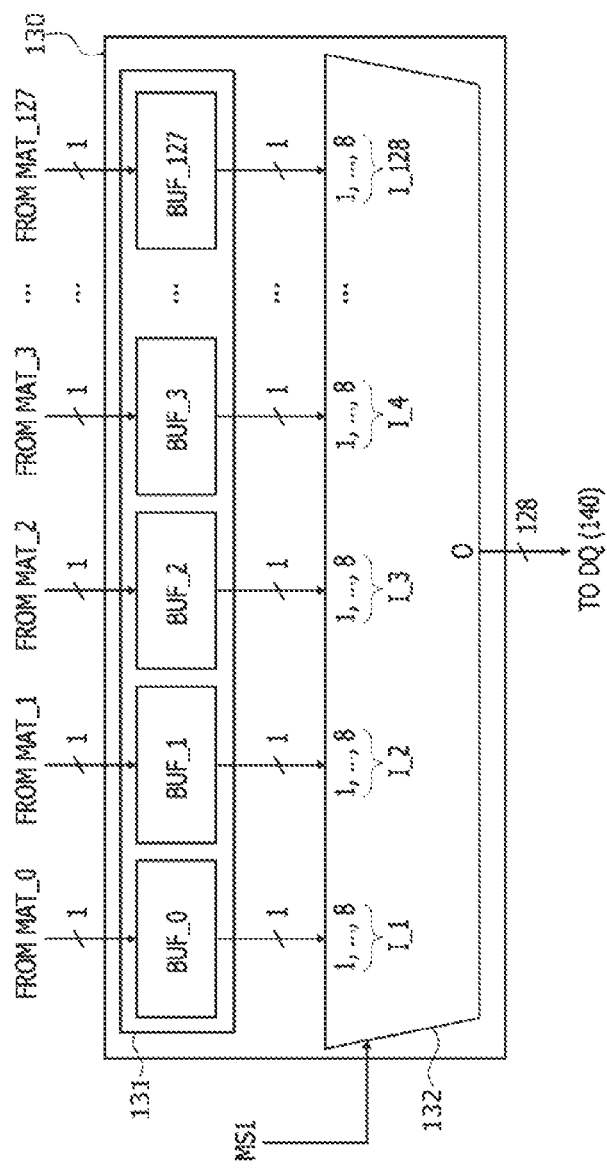
FIG. 7 illustrates an operation of an I/O buffering part in a first operation mode of a memory device according to an embodiment of the present disclosure.
Figure 8:
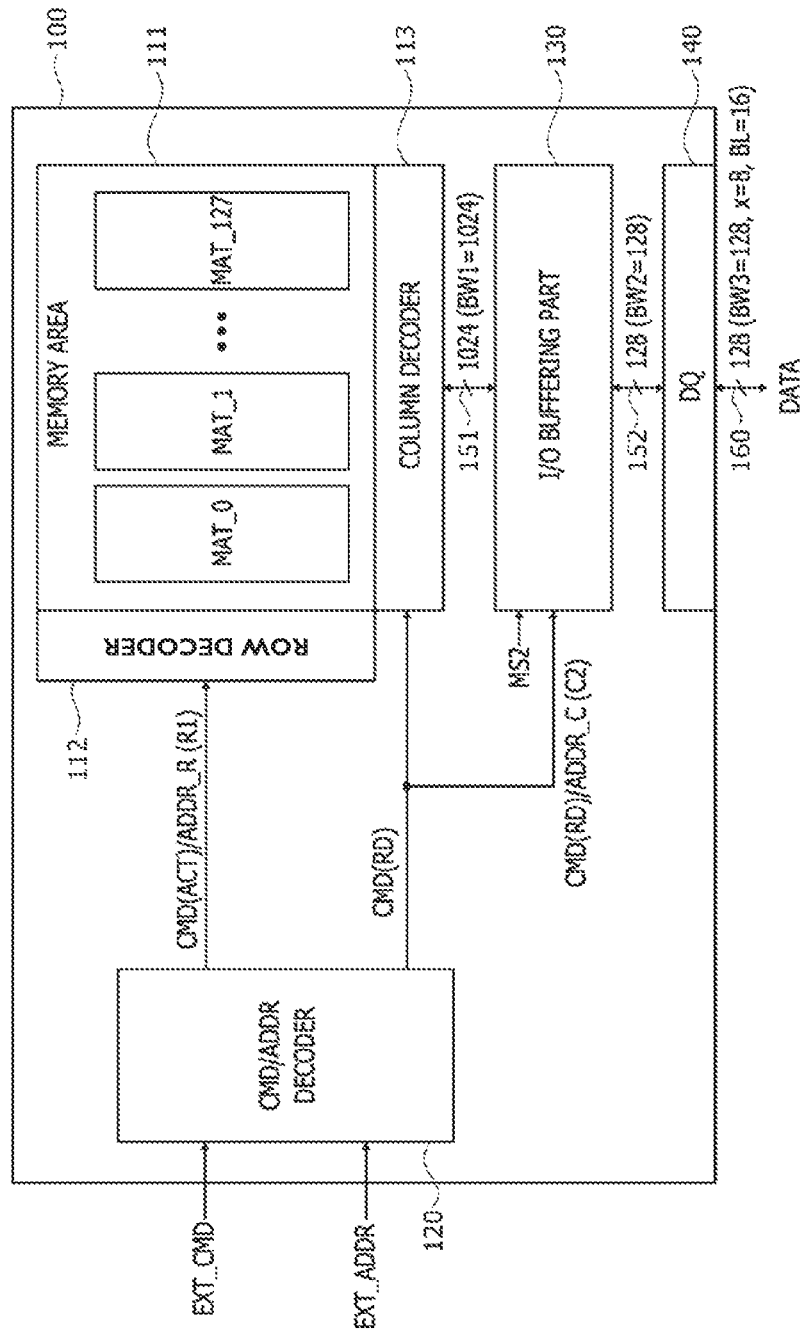
FIG. 8 is a block diagram illustrating a read operation in a second operation mode of a memory device according to an embodiment of the present disclosure.
Figure 9:
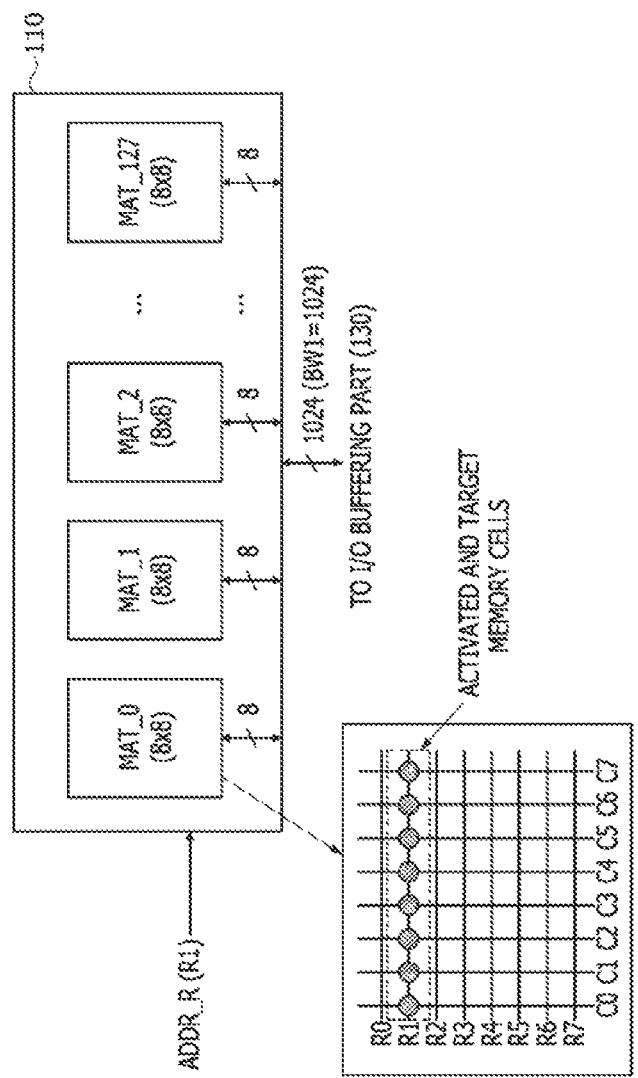
FIG. 9 illustrates the number of bits included in read data outputted from a memory area in a second operation mode of a memory device according to an embodiment of the present disclosure.
Figure 10:
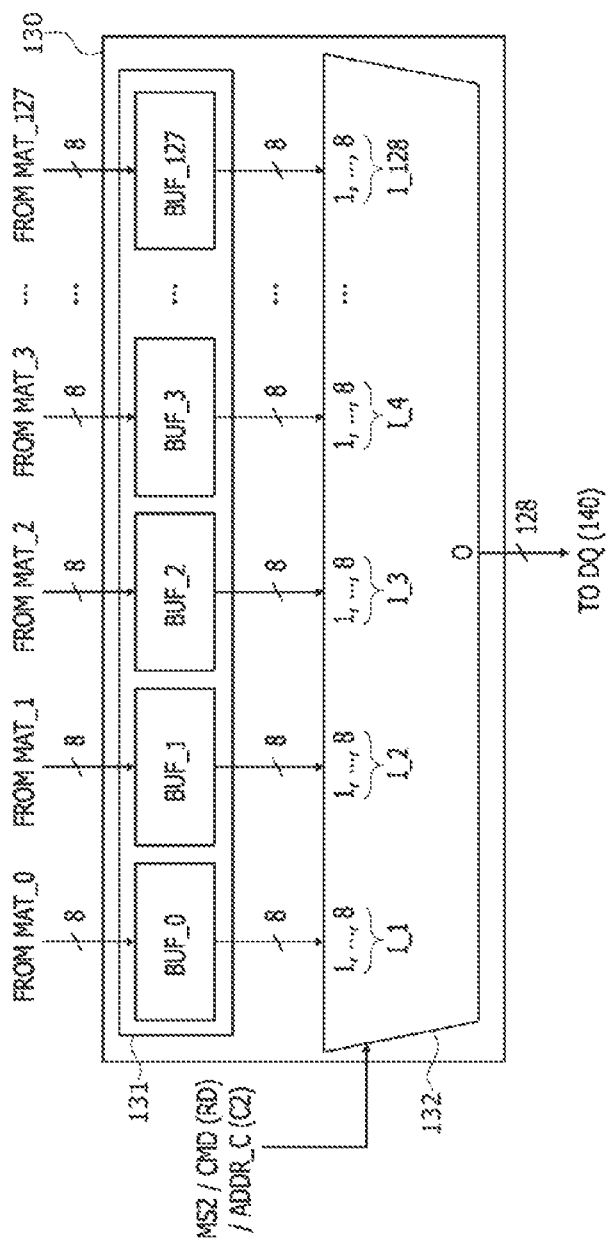
FIG. 10 illustrates an operation of an I/O buffering part in a second operation mode of a memory device according to an embodiment of the present disclosure.

FIGS. 4 to 10 illustrate various operations performed according to the operation mode of the memory device 100. Specifically, FIG. 4 illustrates an example in which the memory area 111 of the memory device 100 includes 128 matrices and each of the matrices includes eight rows and eight columns. FIG. 5 is a block diagram illustrating an operation executed in the first operation mode of the memory device 100 having the memory area 111 illustrated in FIG. 4. FIG. 6 illustrates an amount of data outputted from the memory area 111 in the first operation mode of the memory device 100 having the memory area 111 illustrated in FIG. 4. FIG. 7 illustrates an amount of data which are inputted to and outputted from the I/O buffering part 130 in the first operation mode of the memory device 100 having the memory area 111 illustrated in FIG. 4. FIG. 8 is a block diagram illustrating an operation executed in the second operation mode of the memory device 100 having the memory area 111 illustrated in FIG. 4. FIG. 9 illustrates an amount of data outputted from the memory area 111 in the second operation mode of the memory device 100 having the memory area 111 illustrated in FIG. 4. FIG. 10 illustrates an amount of data which are inputted to and outputted from the I/O buffering part 130 in the second operation mode of the memory device 100 having the memory area 111 illustrated in FIG. 4.

In order to describe various operations performed in the first operation mode and the second operation mode of the memory device 100, it may be assumed that 128 matrices are disposed in the memory area 111 and each of the 128 matrices includes eight rows and eight columns. Specifically, as illustrate in FIG. 4, the memory area 111 includes the first to $128^{th}$ matrices MAT_0, . . . , and MAT_127 and each of the first to $128^{th}$ matrices MAT_0, . . . , and MAT_127 includes eight rows and eight columns. The eight rows may be selected by row addresses R0, . . . , and R7, respectively. In addition, the eight columns may be selected by column addresses C0, . . . , and C7, respectively. The first to $128^{th}$ matrices MAT_0, . . . , and MAT_127 may share the same row address with each other. Each of the first to $128^{th}$ matrices MAT_0, . . . , and MAT_127 may be coupled to a sub-data transmission line having an 8-bit data transmission bandwidth. For example, the first matrix MAT_0 may be coupled to a first sub-data transmission line 151-1 having an 8-bit data transmission bandwidth, and the second matrix MAT_1 may be coupled to a second sub-data transmission line 151-2 having an 8-bit data transmission bandwidth. Similarly, the $128^{th}$ matrix MAT_127 may be coupled to a $128^{th}$ sub-data transmission line 151-128 having an 8-bit data transmission bandwidth. The first to $128^{th}$ sub-data transmission lines 151-1, . . . , and 151-128 may constitute the first internal data transmission line 151 coupled between the memory area 111 and the I/O buffering part (130 of FIG. 1). The first internal data transmission line 151 may have the data transmission bandwidth BW2 of 1024 bits.

As described with reference to FIGS. 1 to 3, in the first operation mode, each of the first to $128^{th}$ matrices MAT_0, . . . , and MAT_127 may output a 1-bit datum stored in a memory cell which is selected by a selected row and a selected column. As the memory area 111 includes 128 matrices, each of which outputs 1-bit data, the memory area 111 may output 128-bit data in the first operation mode. In contrast, in the second operation mode, each of the first to $128^{th}$ matrices MAT_0, . . . , and MAT_127 may output 8-bit data stored in 8 memory cells which are selected by the selected row. As the memory area 111 includes 128 matrices, each of which outputs 8-bit data, the memory area 111 may output 1024-bit data in the second operation mode.

Referring to FIG. 5, it may be assumed that the memory device 100 receives the external command EXT_CMD instructing the read operation and the external address EXT_ADDR including a row address R1 and a column address C2. In addition, the external command EXT_CMD may include information on the first operation mode. In such a case, the command/address decoder 120 may output the active command ACT and the row address R1 to the row decoder 112. Each of the matrices MAT_0, . . . , and MAT_127 may activate a selected row designated by the row address R1 based on the active command ACT and the row address R1. In an embodiment, the activation of the selected row may include an operation transmitting data of the selected row to the sense/amplification circuit (115 of FIG. 2), as described with reference to FIG. 2. After a certain time corresponding to some cycles of a clock signal elapses, the command/address decoder 120 may output the read command RD and the column address C2 to the column decoder 113. The memory area 111, especially, the sense/amplification circuit (115 of FIG. 2) may selectively output data loaded on selected columns designated by the column address C2 through the first internal data transmission line 151.

More specifically, referring to FIG. 6, a second row (indicated by a dotted line in FIG. 6) of the first matrix MAT_0 may be activated by the active command ACT and the row address R1. Thus, data (i.e., 8-bit data) of 8 memory cells arrayed in the second row having the row address R1 may be transmitted to the sense/amplification circuit (115 of FIG. 2). 1-bit data of a target memory cell in a column designated by the column address C2 among the 8-bit data transmitted to the sense/amplification circuit (115 of FIG. 2) may be outputted from the first matrix MAT_0. The same operation as described above may also be equally performed by each of the remaining matrices (i.e., the second to $128^{th}$ matrices MAT_1, . . . , and MAT_127). Accordingly, because each of the first to $128^{th}$ matrices MAT_0, . . . , and MAT_127 constituting the memory area 111 outputs 1-bit data, 128-bit data may be outputted from the memory area 111. The 128-bit data outputted from the memory area 111 may be transmitted to the I/O buffering part 130 through the first internal data transmission line 151 having the data transmission bandwidth BW1 of 1024 bits.

Referring again to FIG. 5, the I/O buffering part 130 receiving the 128-bit data from the memory area 111 may output the 128-bit data as they are in response to the first mode selection control signal MS1 corresponding to the first operation mode. This I/O operation of the I/O buffering part 130 will be described in more detail hereinafter with reference to FIG. 7. That is, 1-bit data outputted from the first matrix MAT_0 of the memory area 111 may be stored into the first buffer memory BUF_0 of the buffer memory part 131, and 1-bit data outputted from the second matrix MAT_1 of the memory area 111 may be stored into the second buffer memory BUF_1 of the buffer memory part 131. In the same way, 1-bit data outputted from the $128^{th}$ matrix MAT_127 of the memory area 111 may be stored into the $128^{th}$ buffer memory BUF_127 of the buffer memory part 131.

The 1-bit data stored in the first buffer memory BUF_0 of the buffer memory part 131 may be transmitted to the first input terminal I_1 of the selection/output part 132. In more detail, the 1-bit data stored in the first buffer memory BUF_0 may be transmitted to the third sub-input terminal 3 corresponding to the column address C2 among the eight sub-input terminals 1, . . . , and 8 constituting the first input terminal I_1. The same data transmission as described above may also be executed between the selection/output part 132 and the remaining buffer memories (i.e., the second to $128^{th}$ buffer memories BUF_1, . . . , and BUF_127). Although not shown in the drawings, a data output operation of the buffer memory part 131 may be performed by an extra control signal. The selection/output part 132 may sequentially output the data inputted to the first to $128^{th}$ input terminals I_1, . . . , and I_128 through the output terminal O in response to the first mode selection control signal MS1. Thus, 128-bit data may be sequentially outputted through the output terminal O of the selection/output part 132. The 128-bit data sequentially outputted from the I/O buffering part 130 may be transmitted to the data I/O part 140 through the second internal data transmission line 152. Although not shown in the drawings, the 128-bit data outputted in series from the I/O buffering part 130 may be converted into parallel data, and the 128-bit parallel data may be transmitted to the data I/O part 140. In such a case, the I/O buffering part 130 may include a deserializer that converts serial data into parallel data.

Referring again to FIG. 5, the data I/O part 140 may output the 128-bit data, which are received from the I/O buffering part 130, through the external bus 160. The external bus 160 may have the data transmission bandwidth BW3 of 128 bits. In an embodiment, the data I/O part 140 may include eight I/O terminals. In such a case, in order that the external bus 160 has the data transmission bandwidth BW3 of 128 bits, 1-bit data may be outputted through each of the eight I/O terminals of the data I/O part 140 and the external bus 160 may have a burst length BL of "16". The burst length BL means the number of data which are sequentially read out in response to one command. Thus, 1-bit data may be outputted through each of the eight I/O terminals 16 times when one command is generated. As a result, 128-bit data may be outputted from the data I/O part 140 though the external bus 160 when one command is generated.

Referring to FIG. 8, it may be assumed that the memory device 100 receives the external command EXT_CMD instructing the read operation and the external address EXT_ADDR including a row address R1 and a column address C2. In addition, the external command EXT_CMD may include information on the second operation mode. In such a case, the command/address decoder 120 may output the active command ACT and the row address R1 to the row decoder 112. Each of the matrices MAT_0, . . . , and MAT_127 disposed in the memory area 111 may activate a selected row designated by the row address R1 based on the active command ACT and the row address R1. In an embodiment, the activation of the selected row may include an operation transmitting data of the selected row to the sense/amplification circuit (115 of FIG. 2), as described with reference to FIG. 2. After a certain time corresponding to some cycles of a clock signal elapses, the command/address decoder 120 may output the read command RD to the column decoder 113. The memory area 111, especially, the sense/amplification circuit (115 of FIG. 2) may output all of data (i.e., 1024-bit data) in the selected row through the first internal data transmission line 151, in response to the read command RD inputted to the column decoder 113.

More specifically, referring to FIG. 9, a second row (indicated by a dotted line in FIG. 9) of the first matrix MAT_0 may be activated by the active command ACT and the row address R1. All of memory cells in the second row may correspond to target memory cells. Thus, data (i.e., 8-bit data) of 8 target memory cells arrayed in the second row having the row address R1 may be transmitted to the sense/amplification circuit (115 of FIG. 2). All of the 8-bit data transmitted to the sense/amplification circuit (115 of FIG. 2) may be outputted from the first matrix MAT_0. That is, no operation for selecting a specific column using the column address may be performed. The same operation as described above may also be equally performed by each of the remaining matrices (i.e., the second to 128$^{th}$ matrices MAT_1, . . . , and MAT_127). Accordingly, because each of the first to 128$^{th}$ matrices MAT_0, . . . , and MAT_127 constituting the memory area 111 outputs 8-bit data, 1024-bit data may be outputted from the memory area 111. The 1024-bit data outputted from the memory area 111 may be transmitted to the I/O buffering part 130 through the first internal data transmission line 151 having the data transmission bandwidth BW1 of 1024 bits.

Referring again to FIG. 8, the I/O buffering part 130 receiving the 1024-bit data from the memory area 111 may selectively output 128-bit data among the 1024-bit data in response to the second mode selection control signal MS2 corresponding to the second operation mode, the read command RD, and the column address C2. This I/O operation of the I/O buffering part 130 will be described in more detail hereinafter with reference to FIG. 10. That is, 8-bit data outputted from the first matrix MAT_0 of the memory area 111 may be stored into the first buffer memory BUF_0 of the buffer memory part 131, and 8-bit data outputted from the second matrix MAT_1 of the memory area 111 may be stored into the second buffer memory BUF_1 of the buffer memory part 131. In the same way, 8-bit data outputted from the 128$^{th}$ matrix MAT_127 of the memory area 111 may be stored into the 128$^{th}$ buffer memory BUF_127 of the buffer memory part 131.

The 8-bit data stored in the first buffer memory BUF_0 of the buffer memory part 131 may be transmitted to the first input terminal I_1 of the selection/output part 132. In more detail, the 8-bit data stored in the first buffer memory BUF_0 may be transmitted to the eight sub-input terminals 1, . . . , and 8 constituting the first input terminal I_1, respectively. The same data transmission as described above may also be executed between the selection/output part 132 and the remaining buffer memories (i.e., the second to 128$^{th}$ buffer memories BUF_1, . . . , and BUF_127). Although not shown in the drawings, a data output operation of the buffer memory part 131 may be performed by an extra control signal. The selection/output part 132 may selectively and sequentially output only the data inputted to the sub-input terminals designated by the column address ADDR_C among the data inputted to the first to 128$^{th}$ input terminals I_1, . . . , and I_128 through the output terminal O, in response to the second mode selection control signal MS2. For example, the selection/output part 132 may output 1-bit data inputted to the third sub-input terminal 3 corresponding to the column address C2 among the first to eighth sub-input terminals 1, . . . , and 8 of the first input terminal I_1 a first time, and the selection/output part 132 may output 1-bit data inputted to the third sub-input terminal 3 corresponding to the column address C2 among the first to eighth sub-input terminals 1, . . . , and 8 of the second input terminal I_2 a second time. This data output operation of the selection/output part 132 may also be equally performed for each of the remaining input terminals (i.e., the third to 128$^{th}$ input terminals I_3, . . . , and I_128). Thus, 1-bit data may be successively outputted through the output terminal O of the selection/output part 132, and 128-bit data may be finally outputted from the selection/output part 132. The 128-bit data sequentially outputted from the I/O buffering part 130 may be transmitted to the data I/O part 140 through the second internal data transmission line 152. Although not shown in the drawings, the 128-bit data outputted in series from the I/O buffering part 130 may be converted into parallel data, and the 128-bit parallel data may be transmitted to the data I/O part 140. In such a case, the I/O buffering part 130 may include a deserializer that converts serial data into parallel data.

Referring again to FIG. 8, the data I/O part 140 may output the 128-bit data, which are received from the I/O buffering part 130, through the external bus 160. The external bus 160 may have the data transmission bandwidth BW3 of 128 bits. In an embodiment, the data I/O part 140 may include eight I/O terminals. In such a case, in order that the external bus 160 has the data transmission bandwidth BW3 of 128 bits, 1-bit data may be outputted through each of the eight I/O terminals of the data I/O part 140 and the external bus 160 may have a burst length BL of "16". Thus, 1-bit data may be outputted through each of the eight I/O terminals 16 times when one command is generated. As a result, 128-bit data may be outputted from the data I/O part 140 though the external bus 160 when one command is generated.

Figure 11:
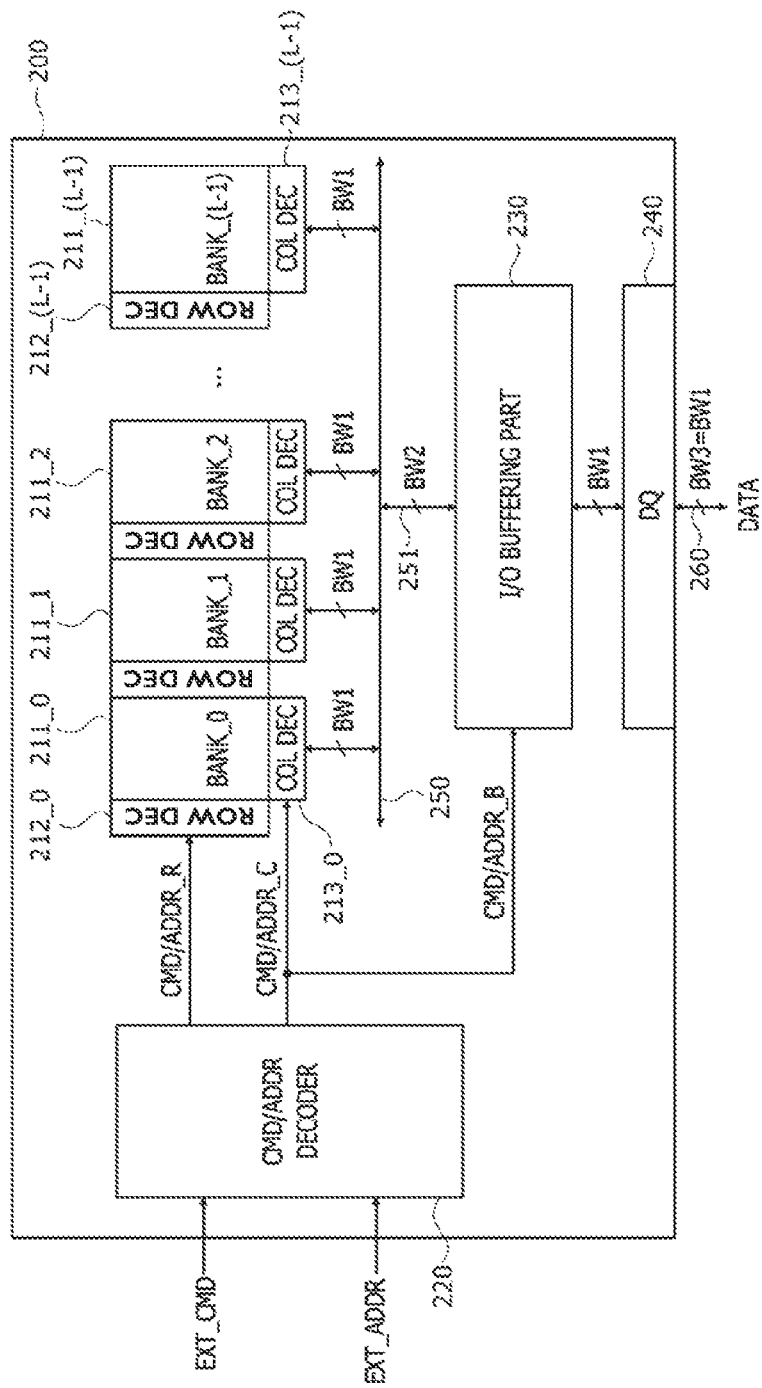
FIG. 11 is a block diagram illustrating a configuration of a memory device according to another embodiment of the present disclosure.
Figure 12:
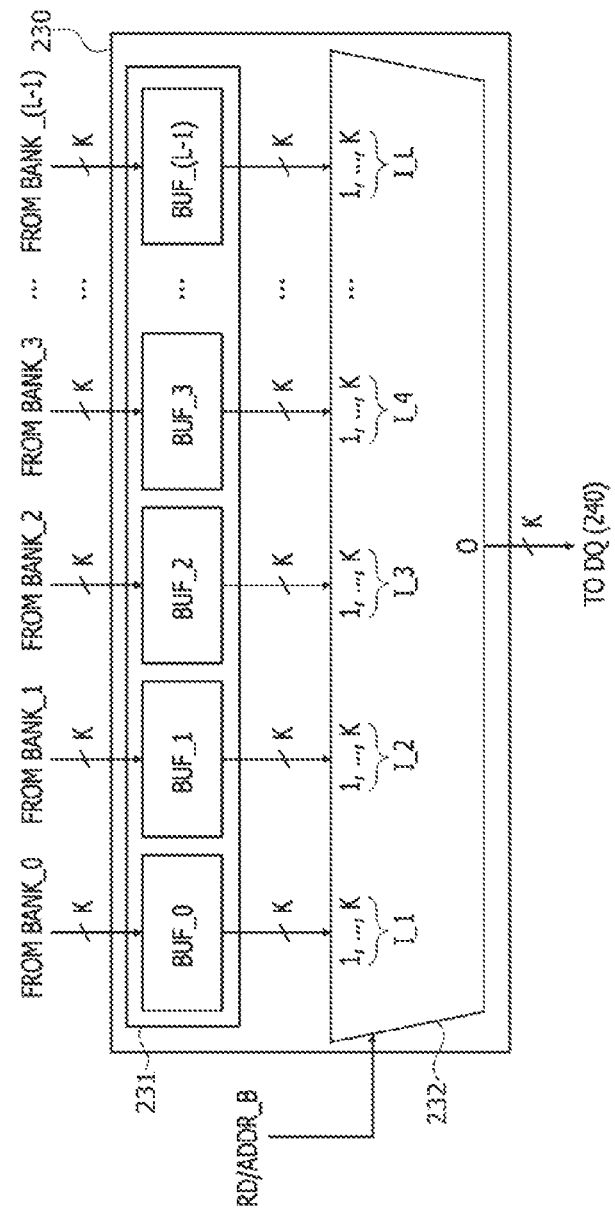
FIG. 12 is a block diagram illustrating an example of an I/O buffering part included in the memory device illustrated in FIG. 11.

FIG. 11 is a block diagram illustrating a configuration of a memory device 200 according to another embodiment of the present disclosure, and FIG. 12 is a block diagram illustrating an example of an I/O buffering part 230 included in the memory device 200 illustrated in FIG. 11. First, referring to FIG. 11, the memory device 200 may include a plurality of banks Bank_0, . . . , and Bank_(L−1) (e.g., first to $L^{th}$ banks 211_0, . . . , and 211_(L−1)), first to $L^{th}$ row decoders 212_0, . . . , and 212_(L−1), first to $L^{th}$ column decoders 213_0, . . . , and 213_(L−1), a command/address decoder 220, the I/O buffering part 230, and a data I/O part 240. In an embodiment, each of the first to $L^{th}$ banks 211_0, . . . , and 211_(L−1) may have the same configuration as the memory area 111 described with reference to FIG. 1. Thus, each of the first to $L^{th}$ banks 211_0, . . . , and 211_(L−1) may include a plurality of matrices. Each of the plurality of matrices included in each of the first to $L^{th}$ banks 211_0, . . . , and 211_(L−1) may have the same configuration as described with reference to FIG. 2.

The first to $L^{th}$ row decoders 212_0, . . . , and 212_(L−1) may be disposed to be allocated to the first to $L^{th}$ banks 211_0, . . . , and 211_(L−1), respectively. Similarly, the first to $L^{th}$ column decoders 213_0, . . . , and 213_(L−1) may also be disposed to be allocated to the first to $L^{th}$ banks 211_0, . . . , and 211_(L−1), respectively. Although not shown in the drawings, in the event that each of the first to $L^{th}$ banks 211_0, . . . , and 211_(L−1) includes a plurality of matrices like the memory area 111 described with reference to FIG. 1, each of the first to $L^{th}$ column decoders 213_0, . . . , and 213_(L−1) may include a plurality of sub-column decoders which are allocated to respective matrices of the plurality of matrices. Each of the first to $L^{th}$ row decoders 212_0, . . . , and 212_(L−1) may receive an active command and a row address ADDR_R from the command/address decoder 220. In the present embodiment, the active command and the row address ADDR_R may be transmitted to all of the first to $L^{th}$ row decoders 212_0, . . . , and 212_(L−1) at substantially the same point in time. Each of the first to $L^{th}$ row decoders 212_0, . . . , and 212_(L−1) may activate a selected row, which is designated by the row address ADDR_R, in response to the active command inputted to all of the first to $L^{th}$ row decoders 212_0, . . . , and 212_(L−1) in common.

Each of the first to $L^{th}$ column decoders 213_0, . . . , and 213_(L−1) may receive a read command and a column address ADDR_C from the command/address decoder 220. Each of the first to $L^{th}$ column decoders 213_0, . . . , and 213_(L−1) may output data of selected columns designated by the column address ADDR_C among all of columns in the selected rows of the first to $L^{th}$ banks 211_0, . . . , and 211_(L−1) in response to the read command. In an embodiment, in the event that each of the first to $L^{th}$ banks 211_0, . . . , and 211_(L−1) includes 128 matrices, 128-bit data may be outputted from each of the first to $L^{th}$ banks 211_0, . . . , and 211_(L−1). In the present embodiment, for the purpose of ease and convenience in explanation, a bank address ADDR_B for selecting a bank and the column address ADDR_C for selecting a column in the selected row may be provided separately. However, in some other embodiments, the bank address ADDR_B may be included in the column address ADDR_C.

The command/address decoder 220 may receive an external command EXT_CMD from an external device such as a memory controller and may decode the external command EXT_CMD to generate and output the command CMD. In addition, the command/address decoder 220 may decode an external address EXT_ADDR to generate and output the row address ADDR_R, the bank address ADDR_B, and the column address ADDR_C. In an embodiment, the active command ACT belonging to the command CMD generated by the command/address decoder 220 and the row address ADDR_R may be transmitted to each of the first to $L^{th}$ row decoders 212_0, . . . , and 212_(L−1). Thus, a row designated by the row address ADDR_R among rows in each of the first to $L^{th}$ banks 211_0, . . . , and 211_(L−1) may be selected and activated by the active command ACT and the row address ADDR_R which are transmitted to each of the first to $L^{th}$ row decoders 212_0, . . . , and 212_(L−1).

A read command (RD of FIG. 12) belonging to the command CMD generated by the command/address decoder 220 may be transmitted to all of the first to $L^{th}$ column decoders 213_0, . . . , and 213_(L−1). Thus, in each of the first to $L^{th}$ banks 211_0, . . . , and 211_(L−1), data of all of columns in the selected row may be transmitted to a global data transmission line 250. The data transmission from each of the first to $L^{th}$ banks 211_0, . . . , and 211_(L−1) to the global data transmission line 250 may be executed in units of bits, the number of which is set by a first data transmission bandwidth BW1. In an embodiment, the first data transmission bandwidth BW1 may be equal to a bandwidth used for data transmission between the memory device 200 and an external device. The first data transmission bandwidth BW1 may be equal to the number of bits included in data outputted from each of the first to $L^{th}$ banks 211_0, . . . , and 211_(L−1).

Data loaded on the global data transmission line 250 may be transmitted to the I/O buffering part 230 through a first internal data transmission line 251. The first internal data transmission line 251 may have a second data transmission bandwidth BW2 which is greater than the first data transmission bandwidth BW1. In an embodiment, the second data transmission bandwidth BW2 may be defined as a value of "BW1×L" (indicating the number of bits) which is obtained by multiplying the first data transmission bandwidth BW1 by the number "L" of the banks 211_0, . . . , and 211_(L−1).

The I/O buffering part 230 may store data outputted from the first to $L^{th}$ banks 211_0, . . . , and 211_(L−1) through the global data transmission line 250 and the first internal data transmission line 251. As illustrated in FIG. 12, the I/O buffering part 230 may include a buffer memory part 231 and a selection/output part 232. The buffer memory part 231 may store data outputted from the first to $L^{th}$ banks 211_0, . . . , and 211_(L−1). In an embodiment, data outputted from the first to $L^{th}$ banks 211_0, . . . , and 211_(L−1) may be transmitted to the buffer memory part 231 in parallel. In an embodiment, the buffer memory part 231 may include a plurality of buffer memories, for example, first to $L^{th}$ buffer memories BUF_0, . . . , and BUF_(L−1). The number of the first to $L^{th}$ buffer memories BUF_0, . . . , and BUF_(L−1) may be equal to the number of the first to $L^{th}$ banks 211_0, . . . , and 211_(L−1). In such a case, the first to $L^{th}$ buffer memories BUF_0, . . . , and BUF_(L−1) may store data outputted from the first to $L^{th}$ banks 211_0, . . . , and 211_(L−1), respectively. For example, the first buffer memory BUF_0 may be configured to store K-bit data outputted from the first bank 211_0, and the second buffer memory BUF_1 may be configured to store K-bit data outputted from the second bank 211_1. In the same way, the $L^{th}$ buffer memory BUF_(L−1) may be configured to store K-bit data outputted from the $L^{th}$ bank 211_(L−1). Thus, the buffer memory part 231 may store "K×L"-bit data and may then output the "K×L"-bit data.

The "K×L"-bit data outputted from the buffer memory part 231 may be inputted to input terminals of the selection/output part 232. In an embodiment, the selection/output part 232 may be realized using a multiplexer having "L"-number of input terminals (i.e., first to $L^{th}$ input terminals I_1, . . . , and I_L) and an output terminal O. Each of the first to $L^{th}$ input terminals I_1, . . . , and I_L may include "K"-number of sub-input terminals (i.e., first to $K^{th}$ sub-input terminals 1, . . . , and K). The first to $L^{th}$ input terminals I_1, . . . , and I_L of the selection/output part 232 may receive the data stored in the first to $L^{th}$ buffer memories BUF_0, . . . , and BUF_(L−1), respectively. For example, the first input terminal I_1 of the selection/output part 232 may receive the data stored in the first buffer memory BUF_0 (i.e., the K-bit data outputted from the first bank (BANK_0) 211_0 and stored in the first buffer memory BUF_0). In an embodiment, the data outputted from the first buffer memory BUF_0 may be transmitted in parallel to the first input terminal I_1 of the selection/output part 232, and the data outputted from the second buffer memory BUF_1 may be transmitted in parallel to the second input terminal I_2 of the selection/output part 232. In the same way, the data outputted from the $L^{th}$ buffer memory BUF_(L−1) may be transmitted in parallel to the $L^{th}$ input terminal I_L of the selection/output part 232.

The selection/output part 232 may sequentially output the data of a selected bank designated by the bank address ADDR_B through the output terminal O of the selection/output part 232, in response to the read command RD and the bank address ADDR_B inputted to a control terminal. Thus, the K-bit data of the selected bank may be outputted through the output terminal O of the selection/output part 232. The K-bit data outputted from the selection/output part 232 may be transmitted to the data I/O part 240. The data outputted from the selection/output part 232 may be transmitted in series through the output terminal O of the selection/output part 232. Thus, the data outputted from the selection/output part 232 through the output terminal O may be converted into parallel data, and the parallel data may then be transmitted to the data I/O part 240. In such a case, the data transmission from the I/O buffering part 230 to the data I/O part 240 may be executed with the same bandwidth as the first data transmission bandwidth BW1. In another embodiment, the data outputted from the selection/output part 232 may be transmitted to the data I/O part 240 in series, and the serial data inputted to the data I/O part 240 may be converted into parallel data by a deserializer to output the parallel data from the data I/O part 240.

Referring again to FIG. 11, the data I/O part 240 may receive data DATA from an external device through an external bus 260 or may output the data DATA to the external device through the external bus 260. The data I/O part 240 may be designed to include a plurality of data I/O terminals. The data I/O part 240 may output the data DATA, which are received from the I/O buffering part 230, to the external device such as a memory controller through the external bus 260. In an embodiment, a data transmission bandwidth BW3 of the external bus 260 may be equal to the number of bits included in the data outputted from each of the first to $L^{th}$ banks 211_0, . . . , and 211_(L−1). That is, the data transmission bandwidth BW3 of the external bus 260 may be equal to the first data transmission bandwidth BW1.

Figure 13:
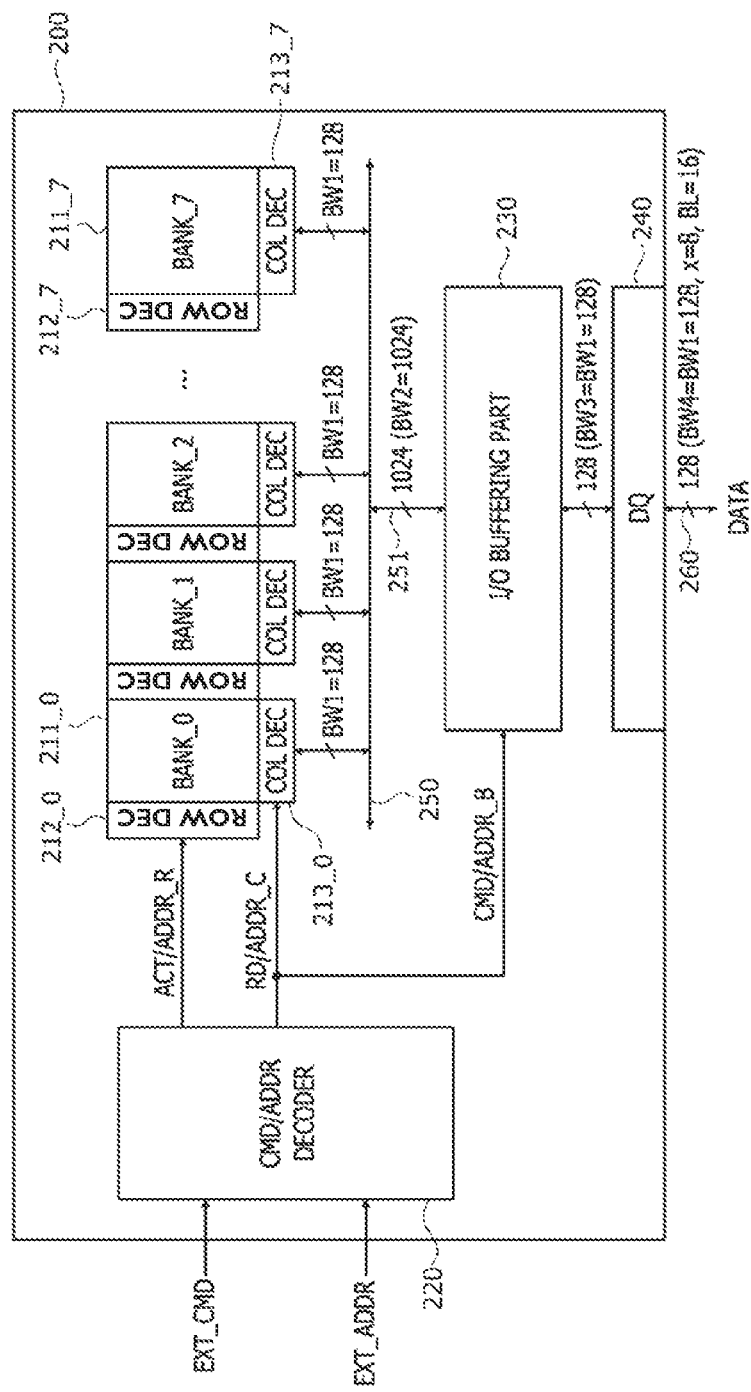
FIG. 13 is a block diagram illustrating a read operation in a second operation mode of a memory device according to another embodiment of the present disclosure.
Figure 14:
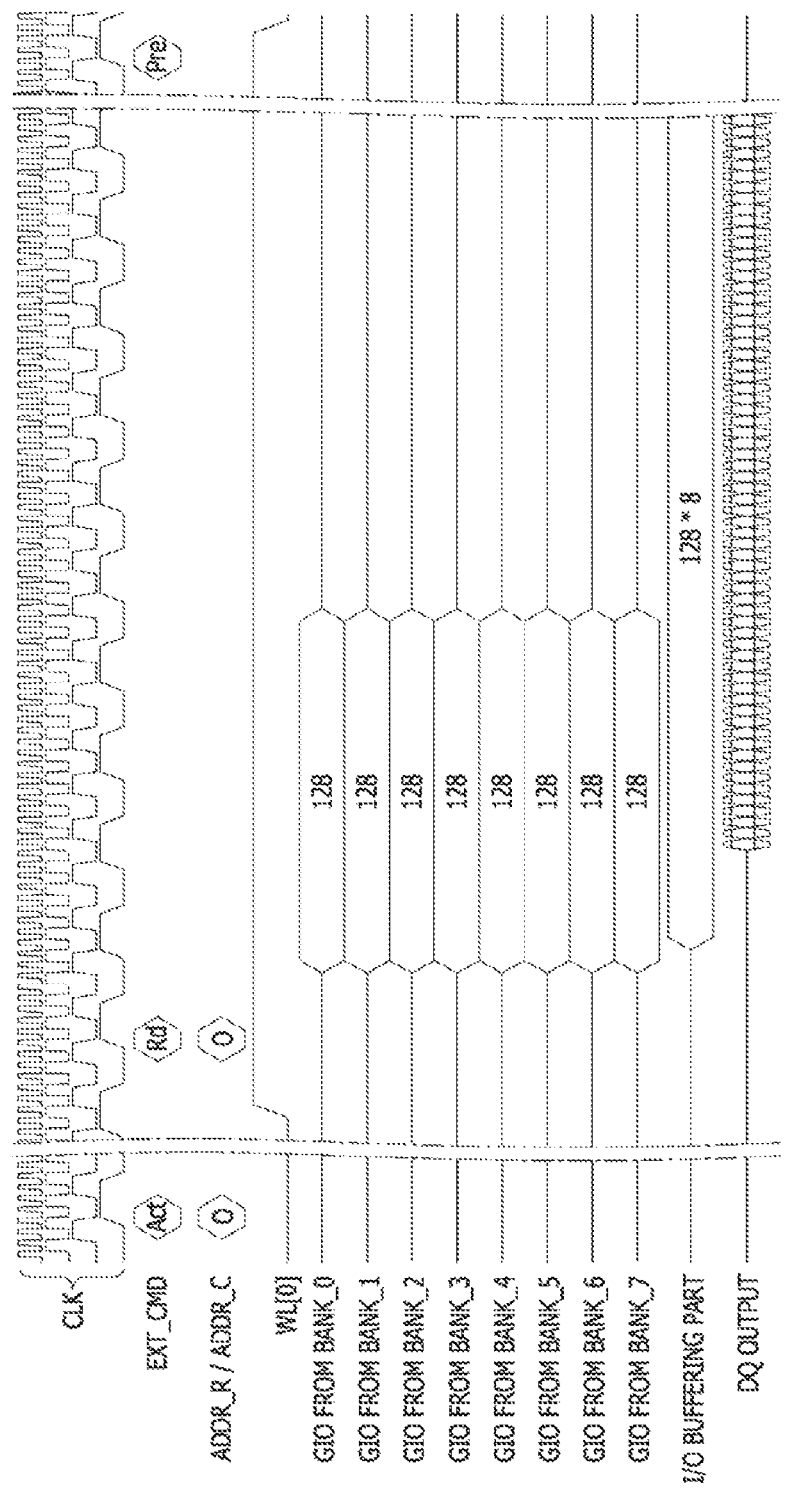
FIG. 14 is a timing diagram illustrating a read operation in a second operation mode of a memory device according to another embodiment of the present disclosure.

FIG. 13 is a block diagram illustrating an operation of the memory device 200 illustrated in FIG. 11, and FIG. 14 is a timing diagram illustrating an operation of the memory device 200. Referring to FIGS. 13 and 14, it may be assumed that the memory device 200 includes eight banks BANK_0, . . . , and BANK_7 (i.e., first to eighth banks 211_0, . . . , and 211_7). In addition, as described with reference to FIG. 4, it may be assumed that each of the first to eighth banks 211_0, . . . , and 211_7 includes 128 matrices and each of the matrices includes eight columns. First, the command/address decoder 220 may receive the external command EXT_CMD and the external address EXT_ADDR from an external device and may output the active command ACT and the row address ADDR_R to each of a plurality of row decoders (i.e., first to eighth row decoders 212_0, . . . , and 212_7). Thus, in each of the first to eighth banks 211_0, . . . , and 211_7, a logic level of a word line of a selected row designated by the row address ADDR_R may change from a logic "low" level into a logic "high" level.

After certain time elapses, the command/address decoder 220 may output the read command RD and the column address ADDR_C to each of a plurality of column decoders (i.e., first to eighth column decoders 213_0, . . . , and 213_7). Thus, each of the first to eighth banks 211_0, . . . , and 211_7 may output data of memory cells selected by the row address ADDR_R and the column address ADDR_C. Because each of the first to eighth banks 211_0, . . . , and 211_7 includes 128 matrices, 128-bit data may be outputted from each of the first to eighth banks 211_0, . . . , and 211_7. In the memory device 200 according to the present embodiment, the 128-bit data outputted from each of the first to eighth banks 211_0, . . . , and 211_7 based on the row address ADDR_R and the column address ADDR_C may be transmitted to the I/O buffering part 230 through the global data transmission line 250. In the present embodiment, because each of the first to eighth banks 211_0, . . . , and 211_7 outputs 128-bit data and the memory device 200 includes eight banks, 1024-bit data may be transmitted to the I/O buffering part 230 through the global data transmission line 250. The 1024-bit data may be transmitted through the first internal data transmission line 251 having the second data transmission bandwidth BW2 of 1024 bits.

The I/O buffering part 230 may transmit data of a bank selected by the bank address ADDR_B among the first to eighth banks 211_0, . . . , and 211_7 to the data I/O part 240. The data I/O part 240 may output the 128-bit data received from the I/O buffering part 230 through the external bus 260 having a data transmission bandwidth BW4 which is equal to the first data transmission bandwidth BW1 of 128 bits. In an embodiment, the data I/O part 240 may include eight I/O terminals. In such a case, in order that the external bus 260 has the data transmission bandwidth BW4 equal to the first data transmission bandwidth BW1 of 128 bits, 1-bit data may be outputted through each of the eight I/O terminals and the external bus 260 may have a burst length BL of "16". Thus, 1-bit data may be outputted through each of the eight I/O terminals 16 times when one command is generated. As a result, 128-bit data may be outputted from the data I/O part 240 though the external bus 260 when one command is generated. As illustrated in FIG. 14, when date latched by the I/O buffering part 230 are sequentially outputted for the banks 211_0, . . . , and 211_7, the data I/O part 240 may output the data without any delay time between the banks 211_0, . . . , and 211_7.

Figure 15:
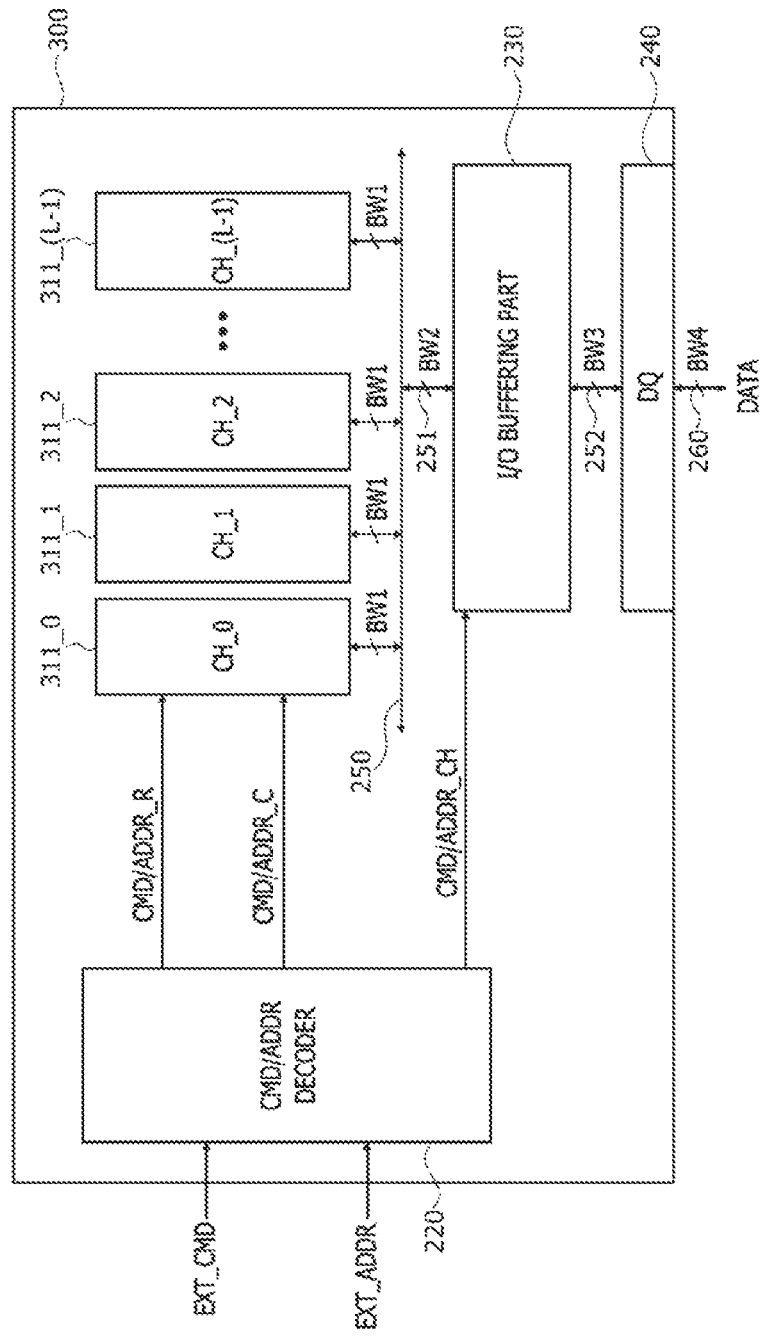
FIG. 15 is a block diagram illustrating a configuration of a memory device according to yet another embodiment of the present disclosure.
Figure 16:
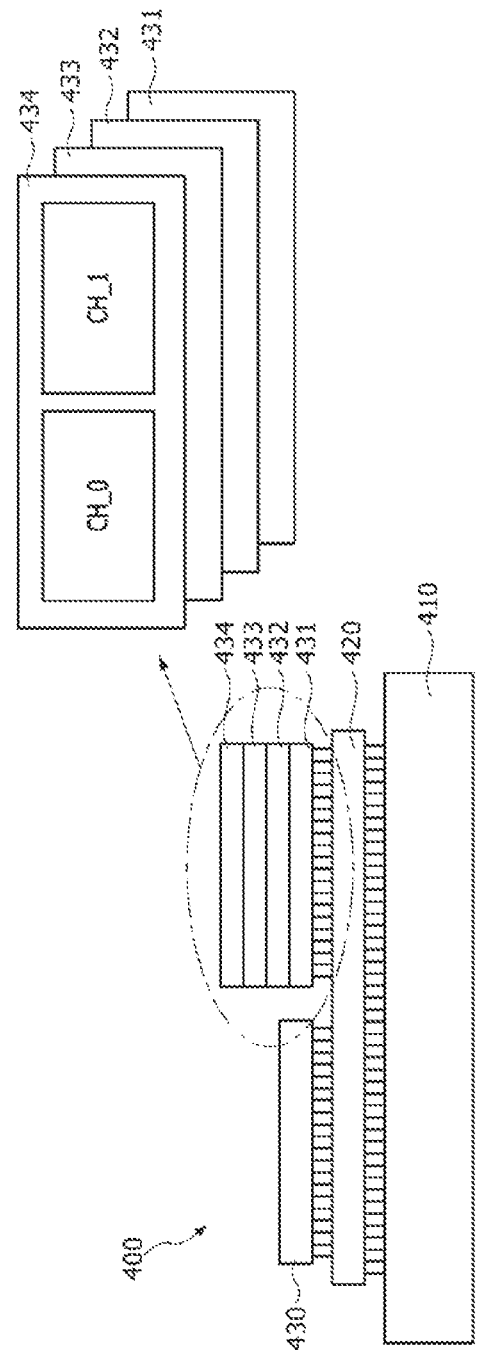
FIG. 16 illustrates an example of a package form in which a memory device according to yet another embodiment of the present disclosure is employed.

FIG. 15 is a block diagram illustrating a memory device 300 according to yet another embodiment of the present disclosure, and FIG. 16 illustrates an example of a package 400 employing the memory device 300 illustrated in FIG. 15. In FIG. 15, the same reference symbols and numerals as used in FIG. 11 may denote the same elements. Thus, detailed descriptions of the same elements as set forth with reference to FIG. 11 will be omitted to avoid a repeated description. First, referring to FIG. 15, the memory device 300 may have substantially the same configuration as the memory device 200 illustrated in FIG. 11 except that the memory device 300 includes a plurality of memory channels (i.e., first to $L^{th}$ memory channels 311_0, . . . , and 311_(L−1)) instead of the plurality of banks 211_0, . . . , and 211_(L−1). A read operation of the first to $L^{th}$ memory channels 311_0, . . . , and 311_(L−1) may be substantially the same as the read operation of the first to $L^{th}$ banks 211_0, . . . , and 211_(L−1) included in the memory device 200 of FIG. 11 except that data are outputted in units of channels and a channel address ADDR_CH instead of the bank address is used.

In an embodiment, the memory channels 311_0, . . . , and 311_(L−1) may be realized using four memory chips 431-434 constituting the package 400 (e.g., a high bandwidth memory (HBM) package), as illustrated in FIG. 16. The HBM package 400 may include a substrate 410 and an interposer 420 disposed on the substrate 410. The four memory chips 431-434 may be sequentially stacked on a portion of the interposer 420. A logic chip 430 may be disposed on another portion of the interposer 420. In an embodiment, each of the memory chips 431-434 may receive or output data through a plurality of channels, for example, two channels. As illustrated in FIG. 16, when the four memory chips 431-434 are stacked and each of the four memory chips 431-434 receives or output data through two channels, the HBM package 400 may receive or output the data through eight memory channels.

Figure 17:
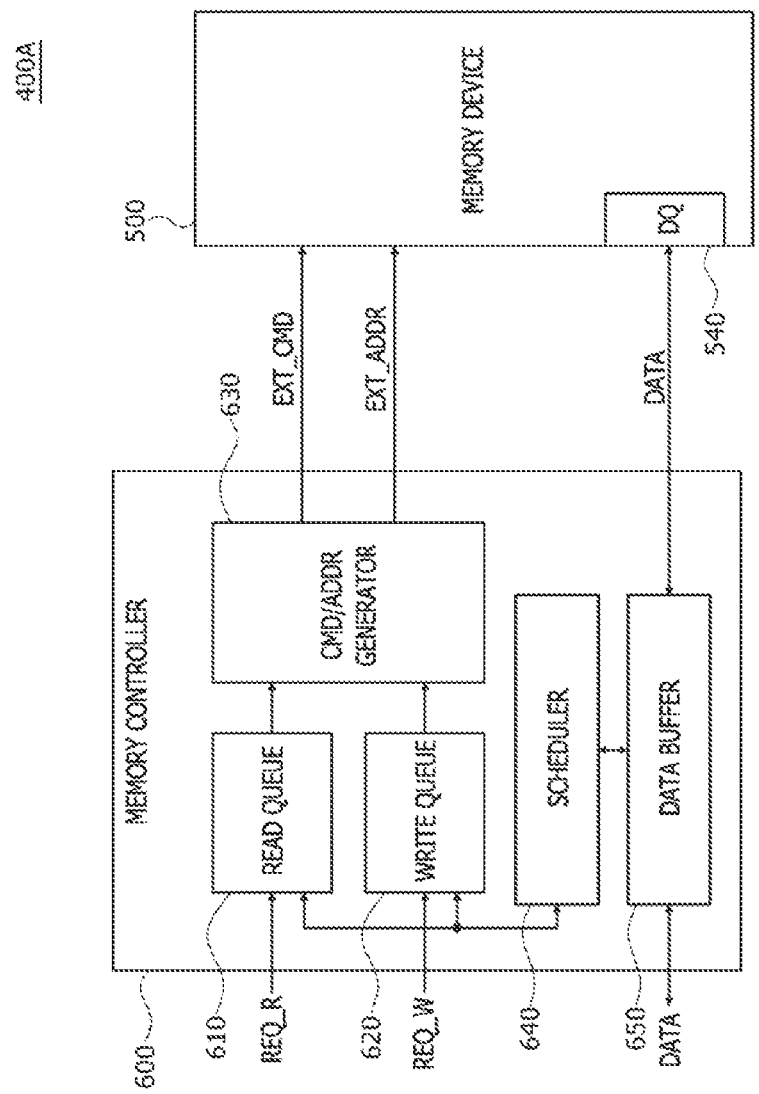
FIG. 17 is a block diagram illustrating a configuration of a memory system according to an embodiment of the present disclosure.

FIG. 17 is a block diagram illustrating a memory system 400A according to an embodiment of the present disclosure. Referring to FIG. 17, the memory system 400A may include a memory device 500 and a memory controller 600. In an embodiment, the memory device 500 included in the memory system 400A may be the memory device 100 described with reference to FIG. 1, the memory device 200 described with reference to FIG. 11, or the memory device 300 described with reference to FIG. 15. Thus, a data I/O part 540, which is disposed in the memory device 500 to perform a data I/O operation, may have the same configuration as the data I/O part 140 of the memory device 100 illustrated FIG. 1 or the data I/O part 240 of the memory device 200 or 300 illustrated FIG. 11 or 15.

The memory controller 600 may perform a control operation for the memory device 500. In an embodiment, the memory controller 600 may include a read queue 610, a write queue 620, a command/address generator 630, a scheduler 640, and a data buffer 650. The read queue 610 may store read request commands REQ_R outputted from an external device, for example, a host. The read queue 610 may output the read request commands REQ_R stored therein according to an order determined by the scheduler 640 to the command/address generator 630. The write queue 620 may store write request commands REQ_W outputted from an external device, for example, a host. The write queue 620 may output the write request commands REQ_W stored therein according to an order determined by the scheduler 640 to the command/address generator 630.

The command/address generator 630 may generate an external command EXT_CMD and an external address EXT_ADDR in response to the read request command REQ_R or the write request command REQ_W outputted from the read queue 610 or the write queue 620. The external command EXT_CMD and the external address EXT_ADDR generated by the command/address generator 630 may be transmitted to the memory device 500. The scheduler 640 may adjust an output sequence of the read request commands REQ_R stored in the read queue 610. In addition, the scheduler 640 may also adjust an output sequence of the write request commands REQ_W stored in the write queue 620. A scheduling operation executed by the scheduler 640 may be performed by an algorithm determined for a high speed operation of the memory device 500, and the scheduling operation will be described in detail hereinafter. The data buffer 650 may temporarily store read data (or write data) during a read operation (or a write operation) of the memory device 500.

The memory system 400A according to the present embodiment may enable the memory device 500 to operate at a high speed through a schedule determined by the scheduler 640 included in the memory controller 600. In such a case, it may be assumed that the memory device 500 operates in the second operation mode. In addition, it may also be assumed that the memory device 500 has the same configuration as the memory device 100 illustrated in FIG. 1. In such a case, the memory controller 600 of the memory system 400A may control the memory device 500 such that a plurality of external commands are successively executed for one selected row in the memory device 500. As described with reference to FIG. 8, all of data of the selected row in the memory device 500 may be latched in the I/O buffering part (130 of FIG. 8) in the second operation mode. Thus, read operations after the first read operation may be performed through only access to the I/O buffering part (130 of FIG. 8) without the active operation and a pre-charge operation for a selected row. As such, the high speed operation of the memory device 500 using the schedule of the memory controller 600 may be equally applied to the memory device 200 of FIG. 11 or the memory device 300 of FIG. 15. Hereinafter, the scheduling operation of the memory controller 600 for the high speed operation of the memory device 500 will be described in detail.

Figure 18:
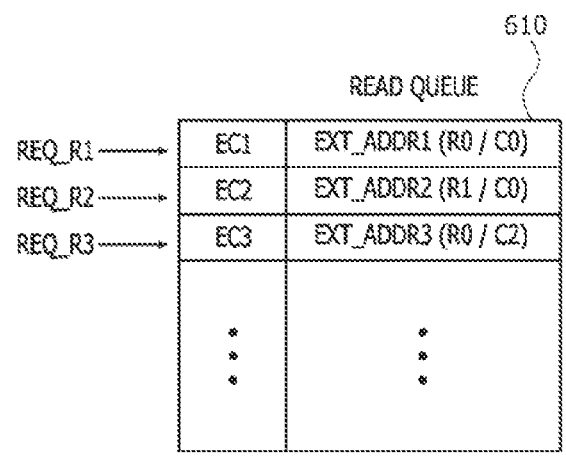
FIG. 18 illustrates an example of read request commands stored in a read queue included in a controller of the memory system illustrated in FIG. 17.

FIG. 18 illustrates an example of the read queue 610 included in the memory controller 600 of the memory system 400A illustrated in FIG. 17. In the present embodiment, it may be assumed that the memory device 500 included in the memory system 400A have the same configuration as the memory device 100 described with reference to FIG. 1. The read queue 610 may store the read queue signals REQ_R sequentially outputted from a host in the same order that the read queue signals REQ_R are outputted from the host. In the present embodiment, it may be assumed that a first read request command REQ_R1, a second read request command REQ_R2, and a third read request command REQ_R3 are sequentially transmitted from a host to the memory controller 600. In such a case, the first read request command REQ_R1, the second read request command REQ_R2, and the third read request command REQ_R3 may be sequentially stored into the read queue 610 in the same order that first to third read request commands REQ_R1, REQ_R2, and REQ_R3 are outputted from the host.

In an embodiment, the first read request command REQ_R1 may include information on a first external command EC1 and a first external address EXT_ADDR1. The first external command EC1 may correspond to a first read command. The first external address EXT_ADDR1 may correspond to a first row address R0 and a first column address C0. The second read request command REQ_R2 may include information on a second external command EC2 and a second external address EXT_ADDR2. The second external command EC2 may correspond to a second read command. The second external address EXT_ADDR2 may correspond to a second row address R1 and a first column address C0. The third read request command REQ_R3 may include information on a third external command EC3 and a third external address EXT_ADDR3. The third external command EC3 may correspond to a third read command. The third external address EXT_ADDR3 may correspond to a first row address R0 and a third column address C2.

Figure 19:
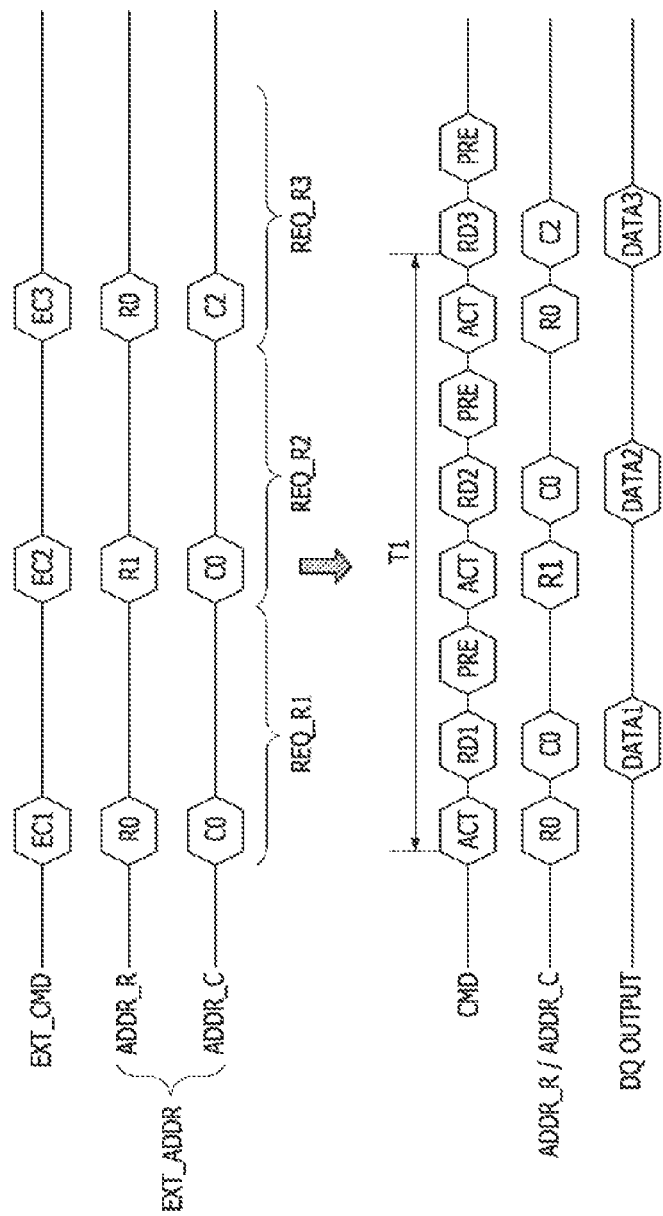
FIG. 19 is a timing diagram illustrating read operations performed by the read queue illustrated in FIG. 18.

FIG. 19 is a timing diagram illustrating an operation of the memory system 400A when the read request commands REQ_R stored in the read queue 610 of FIG. 18 are outputted without being scheduled. In FIG. 19, an upper timing diagram illustrates an operation performed in the memory controller 600, and a lower timing diagram illustrates an operation performed in the memory device 500. Referring to FIGS. 17, 18, and 19, when no schedule is set by the memory controller 600, the read request commands stored in the read queue 610 of the memory controller 600 may be outputted in the same order that the read request commands are transmitted to the read queue 610.

Specifically, the first read request command REQ_R1 may be transmitted from the read queue 610 to the command/address generator 630. The command/address generator 630 may generate and output the first external command EC1 and the first external address EXT_ADDR1 to the memory device 500 in response to the first read request command REQ_R1. In the memory device 500, an active command ACT and the first row address R0 may be generated from the first external command EC1 and the first external address EXT_ADDR1, and the active command ACT and the first row address R0 may be transmitted to the row decoder (112 of FIG. 1). As a result, a first row having the first row address R0 among the plurality of rows may be activated. In the second operation mode, the data of all of the columns in the first row may be stored into the I/O buffering part (130 of FIG. 1). Subsequently, in the memory device 500, a first read command RD1 and the first column address C0 may be generated and may be transmitted to the I/O buffering part (130 of FIG. 1). As a result, first data DATA1 of the first columns selected by the first column address C0 among the data of all of the columns in the first rows, which are stored in the I/O buffering part (130 of FIG. 1), may be outputted from the I/O buffering part (130 of FIG. 1). The first data DATA1 outputted from the I/O buffering part (130 of FIG. 1) may be transmitted from the memory device 500 to the data buffer 650 of the memory controller 600 through the data I/O part 540 of the memory device 500. Subsequently, in the memory device 500, a pre-charge command PRE and the first row address R0 may be generated and may be transmitted to the row decoder (112 of FIG. 1). As a result, the first row having the first row address R0 may be pre-charged.

Next, the second read request command REQ_R2 may be transmitted from the read queue 610 to the command/address generator 630. The command/address generator 630 may generate and output the second external command EC2 and the second external address EXT_ADDR2 to the memory device 500 in response to the second read request command REQ_R2. In the memory device 500, the active command ACT and the second row address R1 may be generated from the second external command EC2 and the second external address EXT_ADDR2, and the active command ACT and the second row address R1 may be transmitted to the row decoder (112 of FIG. 1). As a result, a second row having the second row address R1 among the plurality of rows may be activated. In the second operation mode, the data of all of the columns in the second row may be stored into the I/O buffering part (130 of FIG. 1). Subsequently, in the memory device 500, a second read command RD2 and the first column address C0 may be generated and may be transmitted to the I/O buffering part (130 of FIG. 1). As a result, second data DATA2 of the first columns selected by the first column address C0 among the data of all of the columns in the second rows, which are stored in the I/O buffering part (130 of FIG. 1), may be outputted from the I/O buffering part (130 of FIG. 1). The second data DATA2 outputted from the I/O buffering part (130 of FIG. 1) may be transmitted from the memory device 500 to the data buffer 650 of the memory controller 600 through the data I/O part 540 of the memory device 500. Subsequently, in the memory device 500, the pre-charge command PRE and the second row address R1 may be generated and may be transmitted to the row decoder (112 of FIG. 1). As a result, the second row having the second row address R1 may be pre-charged.

Next, the third read request command REQ_R3 may be transmitted from the read queue 610 to the command/address generator 630. The command/address generator 630 may generate and output the third external command EC3 and the third external address EXT_ADDR3 to the memory device 500 in response to the third read request command REQ_R3. In the memory device 500, the active command ACT and the first row address R0 may be generated from the third external command EC3 and the third external address EXT_ADDR3, and the active command ACT and the first row address R0 may be transmitted to the row decoder (112 of FIG. 1). As a result, the first row having the first row address R0 among the plurality of rows may be activated. In the second operation mode, the data of all of the columns in the first row may be stored into the I/O buffering part (130 of FIG. 1). Subsequently, in the memory device 500, a third read command RD3 and a third column address C2 may be generated and may be transmitted to the I/O buffering part (130 of FIG. 1). As a result, third data DATA3 of the third columns selected by the third column address C2 among the data of all of the columns in the first rows, which are stored in the I/O buffering part (130 of FIG. 1), may be outputted from the I/O buffering part (130 of FIG. 1). The third data DATA3 outputted from the I/O buffering part (130 of FIG. 1) may be transmitted from the memory device 500 to the data buffer 650 of the memory controller 600 through the data I/O part 540 of the memory device 500. Subsequently, in the memory device 500, the pre-charge command PRE and the first row address R0 may be generated and may be transmitted to the row decoder (112 of FIG. 1). As a result, the first row having the first row address R0 may be pre-charged.

As such, when no schedule for a high speed operation is set in the memory controller 600, a first read operation based on the first read request command REQ_R1, a second read operation based on the second read request command REQ_R2, and a third read operation based on the third read request command REQ_R3 may be sequentially performed. Whenever the first read operation, the second read operation, and the third read operation are performed, a row address may change. Thus, three active operations and two pre-charge operations may be required during a period "T1" from a point of in time when the active command ACT for execution of the first read operation is generated until a point in time when the third read command RD3 for execution of the third read operation is generated.

Figure 20:
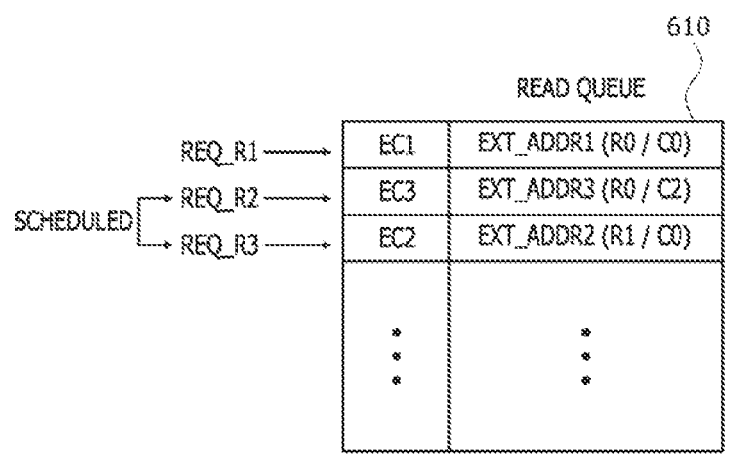
FIG. 20 illustrates an example of read requests, an output sequence of which is changed by a scheduler, stored in a read queue included in a controller of the memory system illustrated in FIG. 17.

FIG. 20 illustrates a state of the read queue 610 after a scheduling operation for a high speed operation of the memory device 500 of FIG. 17 is executed in the memory controller 600. Referring to FIG. 20, the read request commands stored in the read queue 610 may be outputted in order of the first read request command REQ_R1, the third read request command REQ_R3, and the second read request command REQ_R2 by a scheduling operation of the memory controller 600. That is, an output sequence of the second read request command REQ_R2 and the third read request command REQ_R3 may change as compared with an example illustrated in FIG. 18. Accordingly, the first read request command REQ_R1 and the third read request command REQ_R3 requesting read operations for the same row (i.e., the first row which is selected by the first row address R0) are successively outputted from the read queue 610 according to a schedule set by the memory controller 600.

More specifically, a read operation for a memory cell selected by the first row address R0 and the first column address C0 may be firstly performed by the first read request command REQ_R1. Subsequently, a read operation for a memory cell selected by the first row address R0 and the third column address C2 may be performed by the third read request command REQ_R3. Next, a read operation for a memory cell selected by the second row address R1 and the first column address C0 may be performed by the second read request command REQ_R2. As a result, two read operations for the same row address may be successively performed by the first read request command REQ_R1 and the third read request command REQ_R3 which are sequentially outputted from the read queue 610 by the changed schedule of the memory controller 600.

Figure 21:
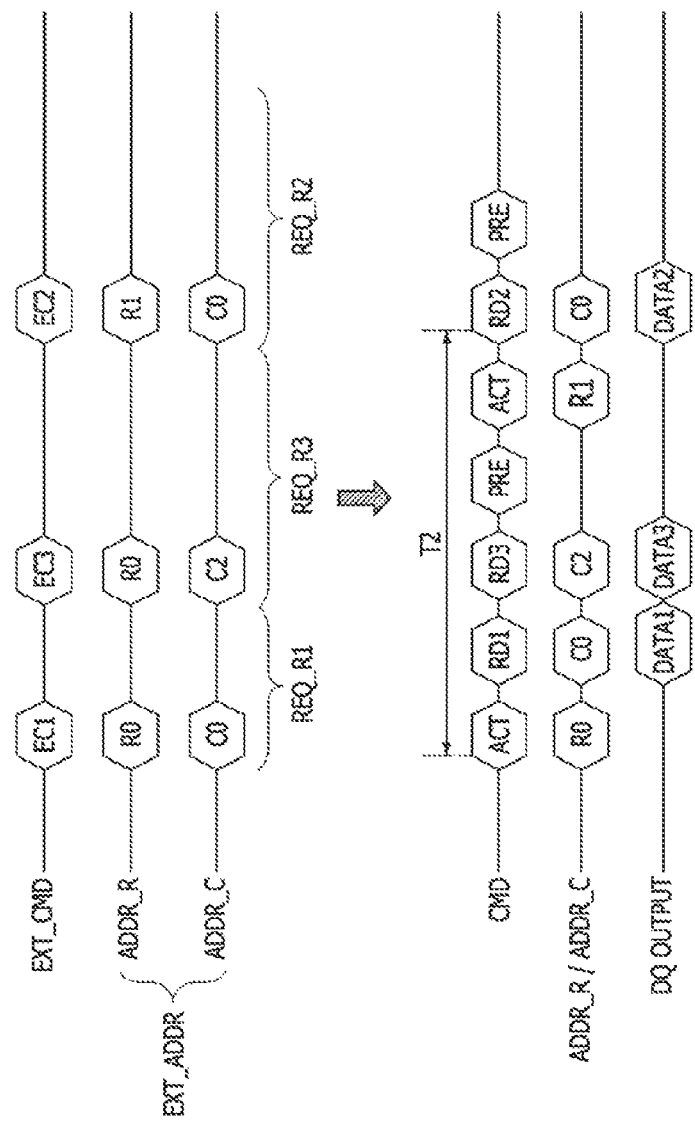
FIG. 21 is a timing diagram illustrating read operations performed by the read queue illustrated in FIG. 20.

FIG. 21 is a timing diagram illustrating an operation of the memory system 400A when the read request commands REQ_R stored in the read queue 610 of FIG. 20 are outputted in order which is determined by scheduling of the memory controller 600 for a high speed operation of the memory device 500. In FIG. 21, an upper timing diagram illustrates an operation performed in the memory controller 600, and a lower timing diagram illustrates an operation performed in the memory device 500. Referring to FIGS. 17, 20, and 21, the read request commands stored in the read queue 610 may be outputted in order which is changed by the scheduler 640.

Specifically, the first read request command REQ_R1 may be transmitted from the read queue 610 to the command/address generator 630. The command/address generator 630 may generate and output the first external command EC1 and the first external address EXT_ADDR1 to the memory device 500 in response to the first read request command REQ_R1. In the memory device 500, the first row having the first row address R0 may be activated by the active command ACT and the first row address R0. Data of all of the columns in the first row may be stored into the I/O buffering part (130 of FIG. 1). Subsequently, first data DATA1 of the first columns selected by the first column address C0 among the data of all of the columns in the first row, which are stored in the I/O buffering part (130 of FIG. 1), may be outputted from the I/O buffering part (130 of FIG. 1) based on the first read command RD1 and the first column address C0. The first data DATA1 outputted from the I/O buffering part (130 of FIG. 1) may be transmitted from the memory device 500 to the data buffer 650 of the memory controller 600 through the data I/O part 540 of the memory device 500. In such a case, no pre-charge operation for the first row is required because a target row to which a next read operation (executed by the third read request command REQ_R3) is applied is the same as the first row to which the previous read operation (executed by the first read request command REQ_R1) is applied.

Next, the third read request command REQ_R3 may be transmitted from the read queue 610 to the command/address generator 630. The command/address generator 630 may generate and output the third external command EC3 and the third external address EXT_ADDR3 to the memory device 500 in response to the third read request command REQ_R3. Because a row address included in the third external address EXT_ADDR3 is the same as the first row address R0 stored in the I/O buffering part (130 of FIG. 1), no accessing to the memory area in the memory device 500 is executed. That is, an operation for transmitting the active command ACT and the row address to the memory area of the memory device 500 may be omitted. If the third read command RD3 and the third column address C2 are generated from the third read request command REQ_R3, third data DATA3 of the third columns selected by the third column address C2 among the data of all of the columns in the first row, which are stored in the I/O buffering part (130 of FIG. 1), may be outputted from the I/O buffering part (130 of FIG. 1) without accessing to the memory area. The third data DATA3 outputted from the I/O buffering part (130 of FIG. 1) may be transmitted from the memory device 500 to the data buffer 650 of the memory controller 600 through the data I/O part 540 of the memory device 500. Subsequently, in the memory device 500, the first row may be pre-charged by the pre-charge command PRE.

Next, the second read request command REQ_R2 may be transmitted from the read queue 610 to the command/address generator 630. The command/address generator 630 may generate and output the second external command EC2 and the second external address EXT_ADDR2 to the memory device 500 in response to the second read request command REQ_R2. In the memory device 500, the second row having the second row address R1 may be activated by the active command ACT and the second row address R1. The data of all of the columns in the second row may be stored into the I/O buffering part (130 of FIG. 1). Subsequently, second data DATA2 of the first columns selected by the first column address C0 among the data of all of the columns in the second row, which are stored in the I/O buffering part (130 of FIG. 1), may be outputted from the I/O buffering part (130 of FIG. 1) based on the second read command RD2 and the first column address C0. The second data DATA2 outputted from the I/O buffering part (130 of FIG. 1) may be transmitted from the memory device 500 to the data buffer 650 of the memory controller 600 through the data I/O part 540 of the memory device 500. Subsequently, in the memory device 500, the second row may be pre-charged by the pre-charge command PRE.

As such, when a schedule for a high speed operation of the memory device 500 is set in the memory controller 600, a first read operation based on the first read request command REQ_R1, a third read operation based on the third read request command REQ_R3, and a second read operation based on the second read request command REQ_R2 may be sequentially performed. In such a case, because the first read operation and the third read operation are successively performed for the same row, the pre-charge operation for the first row and the active operation for activating the first row for the third read operation will be omitted. Thus, only two active operations and one pre-charge operation may be required during a period "T2" from a point of in time when the active command ACT for execution of the first read operation is generated until a point in time when the second read command RD2 for execution of the second read operation is generated.

Figure 22:
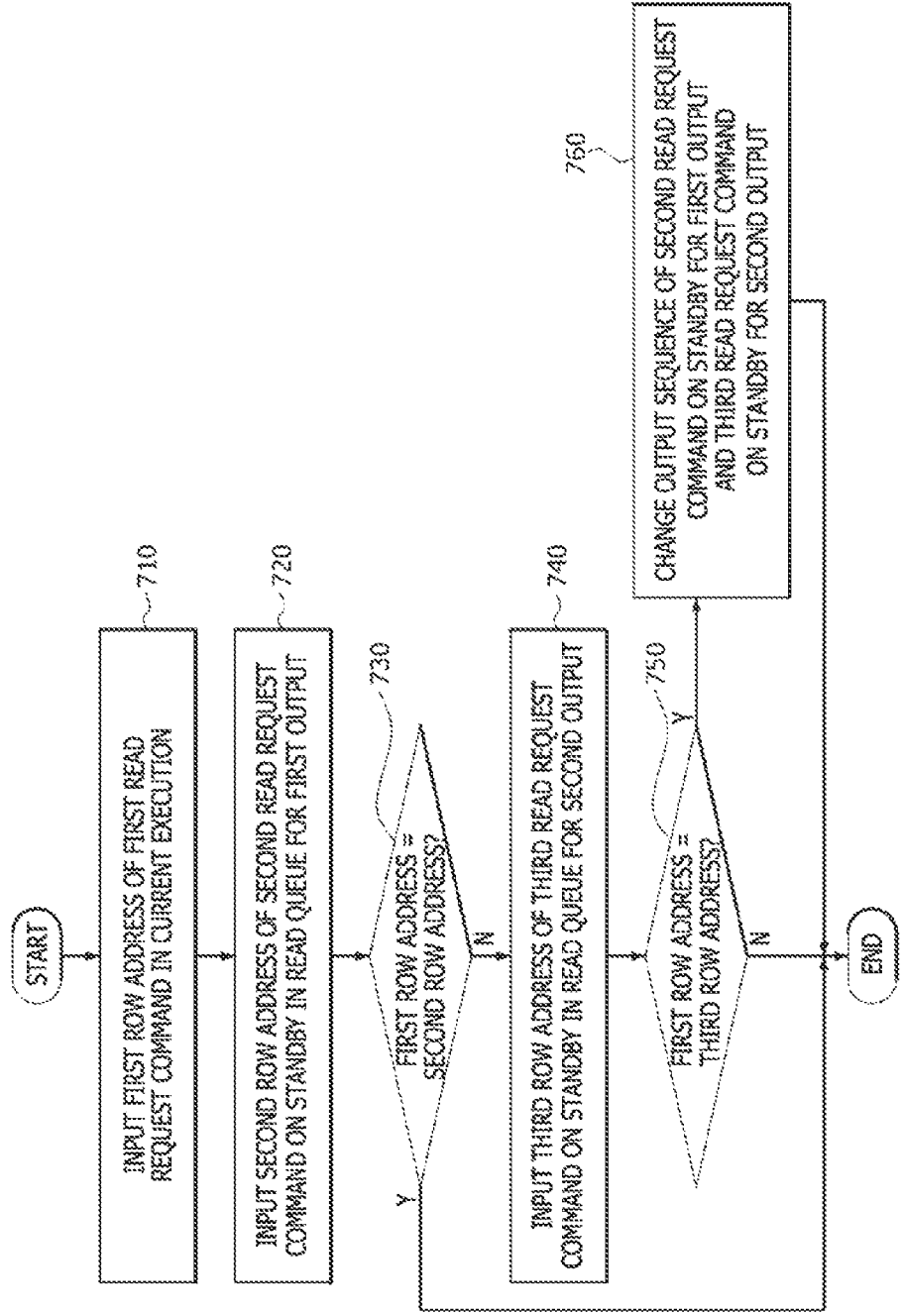
FIG. 22 is a flowchart illustrating an example of a scheduling procedure executed by a memory controller included in a memory system illustrated in FIG. 17.

FIG. 22 is a flowchart illustrating an example of a scheduling operation for a high speed operation of the memory device 500 included in the memory system 400A illustrated in FIG. 17. Referring to FIGS. 17 and 22, a first row address of a first read request command in current execution among read request commands stored in the read queue 610 may be inputted to the scheduler 640 (see a step 710). After the first row address of the first read request command is inputted to the scheduler 640 at the step 710, a second row address of a second read request command on standby for a first output among the read request commands stored in the read queue 610 may be inputted to the scheduler 640 (see a step 720). The scheduler 640 may compare the second row address with the first row address to determine whether the second row address is the same as the first row address (see a step 730).

If the second row address is the same as the first row address at the step 730, an original sequence that the second read request command is outputted from the read queue 610 may be maintained. In contrast, if the second row address is different from the first row address at the step 730, a third row address of a third read request command on standby for a second output among the read request commands stored in the read queue 610 may be inputted to the scheduler 640 (see a step 740). The scheduler 640 may compare the third row address with the first row address to determine whether the third row address is the same as the first row address (see a step 750). If the third row address is different from the first row address at the step 750, the scheduling operation may terminate to maintain an original output sequence of the third read request command. In contrast, if the third row address is the same as the first row address at the step 750, the scheduler 640 may exchange output sequences of the second read request command and the third read request command which are stored in the read queue 610 (see a step 760). Thus, the first and third read request commands selecting the same row may be successively executed.

Figure 23:
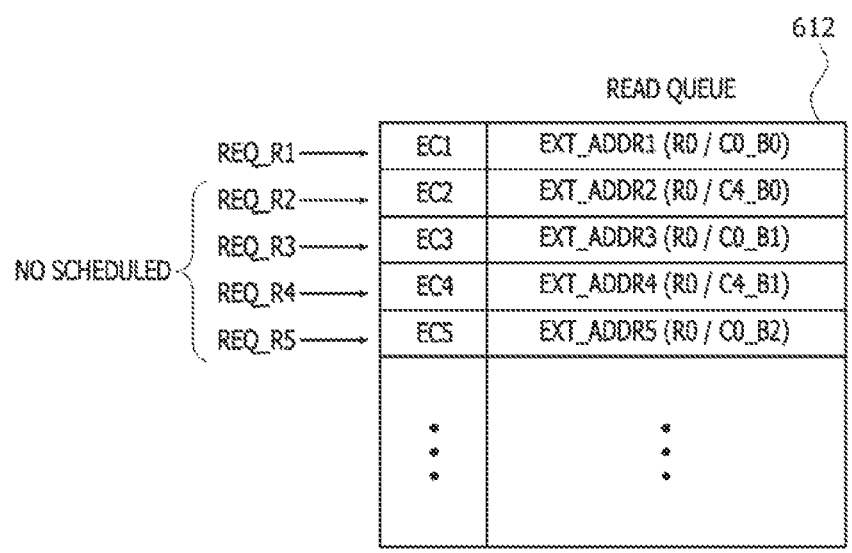
FIG. 23 illustrates another example of read request commands stored in a read queue included in a controller of the memory system illustrated in FIG. 17.

FIG. 23 illustrates a read queue 612 corresponding to another example of the read queue 610 included in the memory controller 600 of the memory system 400A illustrated in FIG. 17. In the present embodiment, it may be assumed that the memory device 500 included in the memory system 400A have the same configuration as the memory device 200 described with reference to FIG. 11 or the memory device 300 described with reference to FIG. 15. The read queue 612 may store the read queue signals REQ_R sequentially outputted from a host in the same order that the read queue signals REQ_R are outputted from the host. In the present embodiment, it may be assumed that a first read request command REQ_R1, a second read request command REQ_R2, a third read request command REQ_R3, a fourth read request command REQ_R4, and a fifth read request command REQ_R5 are sequentially transmitted from a host to the memory controller 600. In such a case, the first read request command REQ_R1, the second read request command REQ_R2, the third read request command REQ_R3, the fourth read request command REQ_R4, and the fifth read request command REQ_R5 may be sequentially stored into the read queue 612 in the same order that first to fifth read request commands REQ_R1, REQ_R2, REQ_R3, REQ_R4, and REQ_R5 are outputted from the host.

In an embodiment, the first read request command REQ_R1 may include information on a first external command EC1 and a first external address EXT_ADDR1. The first external command EC1 may correspond to a first read command for performing a first read operation. The first external address EXT_ADDR1 may be decoded to generate a first row address R0, a first column address C0, and a first bank address B0. The second read request command REQ_R2 may include information on a second external command EC2 and a second external address EXT_ADDR2. The second external command EC2 may correspond to a second read command for performing a second read operation. The second external address EXT_ADDR2 may be decoded to generate the first row address R0, a fifth column address C4, and the first bank address B0. The third read request command REQ_R3 may include information on a third external command EC3 and a third external address EXT_ADDR3. The third external command EC3 may correspond to a third read command for performing a third read operation. The third external address EXT_ADDR3 may be decoded to generate the first row address R0, the first column address C0, and a second bank address B1. The fourth read request command REQ_R4 may include information on a fourth external command EC4 and a fourth external address EXT_ADDR4. The fourth external command EC4 may correspond to a fourth read command for performing a fourth read operation. The fourth external address EXT_ADDR4 may be decoded to generate the first row address R0, the fifth column address C4, and the second bank address B1. The fifth read request command REQ_R5 may include information on a fifth external command EC5 and a fifth external address EXT_ADDR5. The fifth external command EC5 may correspond to a fifth read command for performing a fifth read operation. The fifth external address EXT_ADDR5 may be decoded to generate the first row address R0, the first column address C0, and a third bank address B2.

Figure 24:
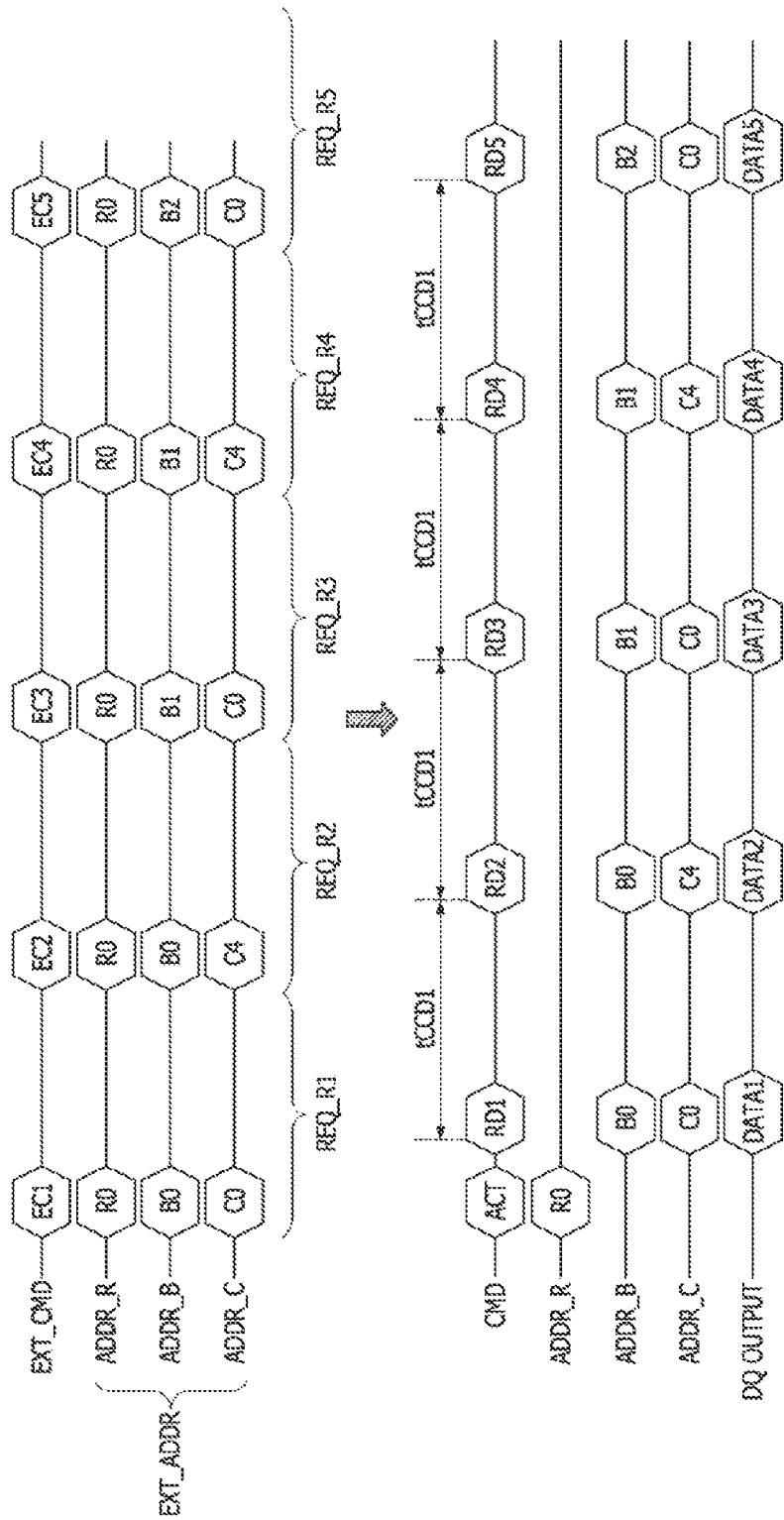
FIG. 24 is a timing diagram illustrating read operations performed by the read queue illustrated in FIG. 23.

FIG. 24 is a timing diagram illustrating an operation of the memory system 400A when the read request commands REQ_Rs stored in the read queue 612 of FIG. 23 are outputted without being scheduled. In FIG. 24, an upper timing diagram illustrates an operation performed in the memory controller 600, and a lower timing diagram illustrates an operation performed in the memory device 500. Referring to FIGS. 17, 23, and 24, when no schedule is set by the memory controller 600, the read request commands REQ_Rs stored in the read queue 612 of the memory controller 600 may be outputted in the same order that the read request commands REQ_Rs are transmitted to the read queue 612.

Specifically, the first read request command REQ_R1 may be transmitted from the read queue 612 to the command/address generator 630. The command/address generator 630 may generate and output the first external command EC1 and the first external address EXT_ADDR1 to the memory device 500 in response to the first read request command REQ_R1. In the memory device 500, an active command ACT and the first row address R0 may be generated from the first external command EC1 and the first external address EXT_ADDR1, and the active command ACT and the first row address R0 may be transmitted to all of the row decoders (212_0, . . . , and 212_(L−1) of FIG. 11) coupled to respective banks of the banks (211_0, . . . , and 211_(L−1) of FIG. 11). As a result, a first row having the first row address R0 among the plurality of rows included in each of the banks (211_0, . . . , and 211_(L−1) of FIG. 11) may be activated. Subsequently, in the memory device 500, a first read command RD1 and the first column address C0 may be generated and may be transmitted to all of the column decoders (213_0, . . . , and 213_(L−1) of FIG. 11). As a result, data of first columns selected by the first column address C0 among data of all of columns in the first rows in the banks (211_0, . . . , and 211_(L−1) of FIG. 11) may be stored into the I/O buffering part (230 of FIG. 11). Subsequently, in the memory device 500, the first read command RD1 and the first bank address B0 may be transmitted to the I/O buffering part (230 of FIG. 11). As a result, first data DATA1 of the first columns in the first rows in the first bank (211_0 of FIG. 11) selected by the first bank address B0 among the data stored in the I/O buffering part (230 of FIG. 11) may be outputted from the I/O buffering part (230 of FIG. 11). The first data DATA1 outputted from the I/O buffering part (230 of FIG. 11) may be transmitted from the memory device 500 to the data buffer 650 of the memory controller 600 through the data I/O part 540 of the memory device 500. Like the present embodiment, when all of the read request commands REQ_Rs are signals for requesting the read operations for the same row (i.e., the first row), a pre-charge operation for the first rows having the first row address R0 may be omitted.

Next, the second read request command REQ_R2 may be transmitted from the read queue 612 to the command/address generator 630. The command/address generator 630 may generate and output the second external command EC2 and the second external address EXT_ADDR2 to the memory device 500 in response to the second read request command REQ_R2. Like the present embodiment, when all of the read request commands REQ_Rs are signals for requesting the read operations for the same row (i.e., the first row), an active operation for the first rows having the first row address R0 may be omitted. In the memory device 500, a second read command RD2 and the fifth column address C4 may be generated and may be transmitted to all of the column decoders (213_0, . . . , and 213_(L−1) of FIG. 11). As a result, data of fifth columns selected by the fifth column address C4 among data of all of columns in the first rows in the banks (211_0, . . . , and 211_(L−1) of FIG. 11) may be stored into the I/O buffering part (230 of FIG. 11). Subsequently, in the memory device 500, the second read command RD2 and the first bank address B0 may be transmitted to the I/O buffering part (230 of FIG. 11). As a result, second data DATA2 of the fifth columns in the first rows in the first bank (211_0 of FIG. 11) selected by the first bank address B0 among the data stored in the I/O buffering part (230 of FIG. 11) may be outputted from the I/O buffering part (230 of FIG. 11). The second data DATA2 outputted from the I/O buffering part (230 of FIG. 11) may be transmitted from the memory device 500 to the data buffer 650 of the memory controller 600 through the data I/O part 540 of the memory device 500.

A third read operation based on the third read request command REQ_R3, a fourth read operation based on the fourth read request command REQ_R4, and a fifth read operation based on the fifth read request command REQ_R5 may also be sequentially performed, and each of the third to fifth read operations may be the same as the second read operation performed by the second read request command REQ_R2. In such a case, because a column (i.e., the first column) accessed by the first read command RD1 and a column (i.e., the fifth column) accessed by the second read command RD2 are different from each other, a time interval of "tCCD1" may exist between a point in time when the first read command RD1 is generated and a point in time when the second read command RD2 is generated. The time interval of "tCCD1" means a minimum time interval between two read commands for successively performing two read operations. Similarly, the time interval of "tCCD1" may also be required between the second read command RD2 and the third read command RD3 selecting two different columns, between the third read command RD3 and the fourth read command RD4 selecting two different columns, and between the fourth read command RD4 and the fifth read command RD5 selecting two different columns.

Figure 25:
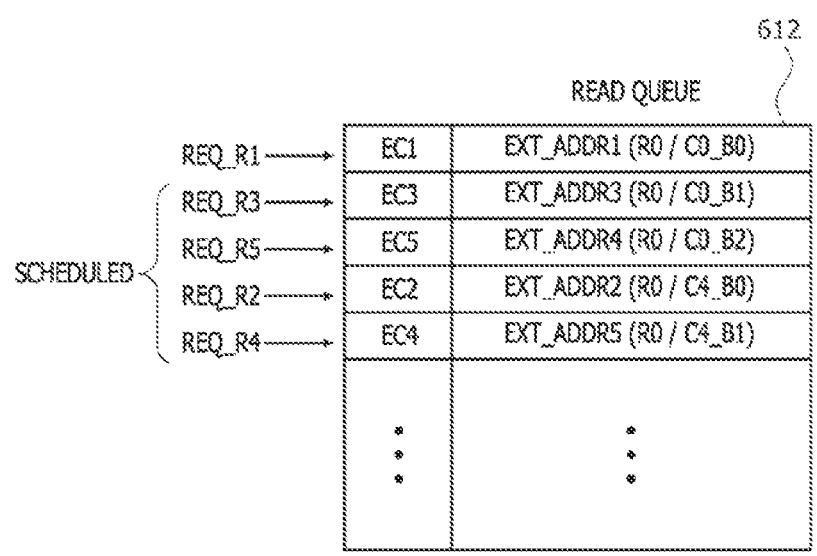
FIG. 25 illustrates another example of read requests, an output sequence of which is changed by a scheduler, stored in a read queue included in a controller of the memory system illustrated in FIG. 17.

FIG. 25 illustrates a state of the read queue 612 of FIG. 23 after the read request commands stored in the read queue 612 are scheduled for a high speed operation of the memory device 500. Referring to FIG. 25, the read request commands stored in the read queue 612 may be outputted in order of the first read request command REQ_R1, the third read request command REQ_R3, the fifth read request command REQ_R5, the second read request command REQ_R2, and the fourth read request command REQ_R4 by a scheduling operation of the memory controller 600. That is, although the bank address changes whenever the first read request command REQ_R1, the third read request command REQ_R3, the fifth read request command REQ_R5, the second read request command REQ_R2, and the fourth read request command REQ_R4 are sequentially outputted from the read queue 612, the first read request command REQ_R1, the third read request command REQ_R3, and the fifth read request command REQ_R5 may be sequentially outputted from the read queue 612 to perform read operations for the same column (i.e., the first column selected by the first column address C0). Similarly, the second read request command REQ_R2 and the fourth read request command REQ_R4 may be sequentially outputted from the read queue 612 to perform read operations for the same column (i.e., the fifth column selected by the fifth column address C4).

Due to the scheduling described above, the first read request command REQ_R1, the third read request command REQ_R3, and the fifth read request command REQ_R5 requesting read operations for the first column selected by the first column address C0 may be sequentially outputted from the read queue 612. Accordingly, the first read request command REQ_R1 may be firstly executed to perform a read operation for reading out data of memory cells selected by the first row address R0 and the first column address C0 among memory cells disposed in the first bank (211_0 of FIG. 11) selected by the first bank address B0. Subsequently, the third read request command REQ_R3 may be executed to perform a read operation for reading out data of memory cells selected by the first row address R0 and the first column address C0 among memory cells disposed in the second bank (211_1 of FIG. 11) selected by the second bank address B1. Next, the fifth read request command REQ_R5 may be executed to perform a read operation for reading out data of memory cells selected by the first row address R0 and the first column address C0 among memory cells disposed in the third bank (211_2 of FIG. 11) selected by the third bank address B2.

If the fifth read request command REQ_R5 is outputted from the read queue 612 and the memory device 500 terminates the read operation in response to the fifth read request command REQ_R5, the second read request command REQ_R2 and the fourth read request command REQ_R4 may be sequentially outputted from the read queue 612 to read out the data of the fifth column selected by the fifth column address C4. Thus, the second read request command REQ_R2 may be executed to perform a read operation for reading out data of memory cells selected by the first row address R0 and the fifth column address C4 among memory cells disposed in the first bank (211_0 of FIG. 11) selected by the first bank address B0. Subsequently, the fourth read request command REQ_R4 may be executed to perform a read operation for reading out data of memory cells selected by the first row address R0 and the fifth column address C4 among memory cells disposed in the second bank (211_1 of FIG. 11) selected by the second bank address B1.

Figure 26:
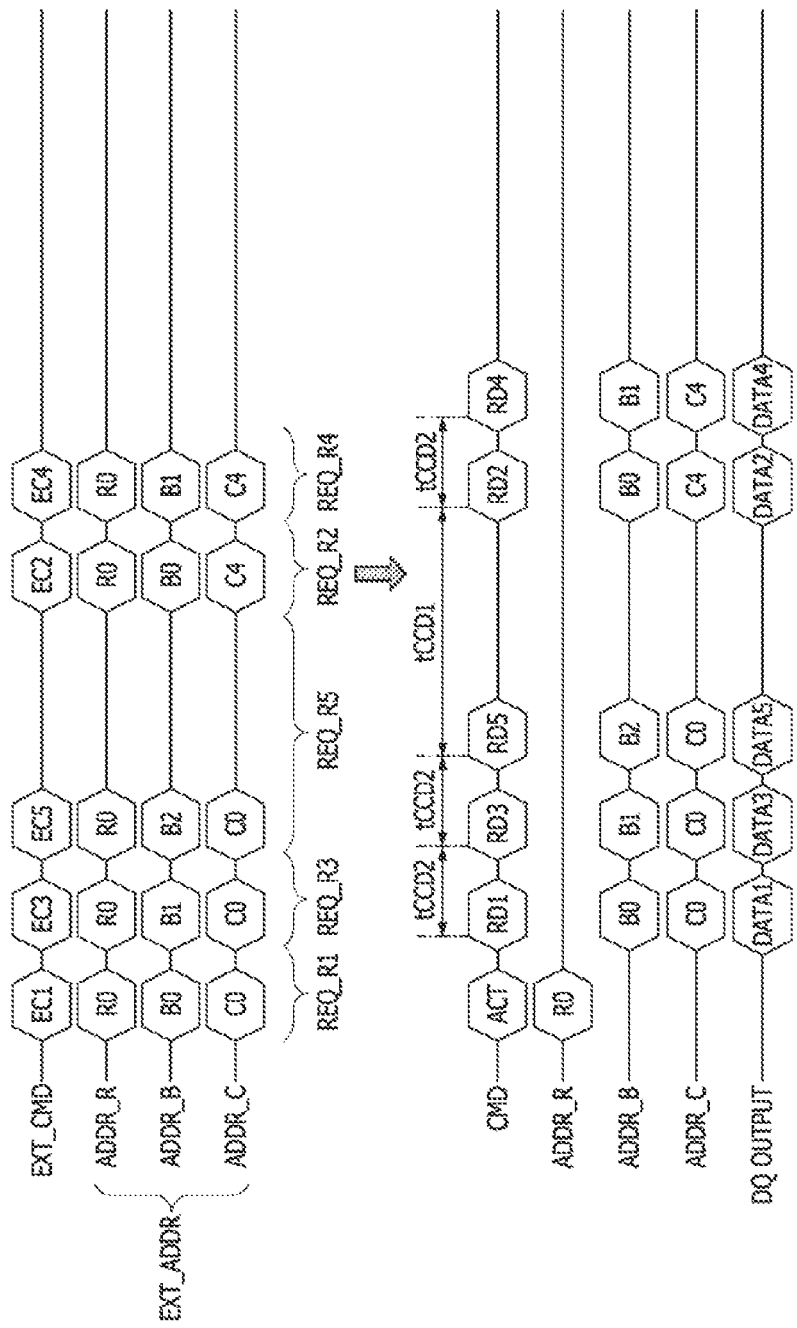
FIG. 26 is a timing diagram illustrating read operations performed by the read queue illustrated in FIG. 25.

FIG. 26 is a timing diagram illustrating read operations of the memory system 400A which are performed according to an output sequence of the read request commands REQ_Rs stored in the read queue 612 of FIG. 25. In FIG. 26, an upper timing diagram illustrates an operation performed in the memory controller 600, and a lower timing diagram illustrates an operation performed in the memory device 500. Referring to FIGS. 17, 25, and 26, the first read request command REQ_R1 may be transmitted from the read queue 612 to the command/address generator 630. The command/address generator 630 may generate and output the first external command EC1 and the first external address EXT_ADDR1 to the memory device 500 in response to the first read request command REQ_R1. In response to the first external command EC1 and the first external address EXT_ADDR1, the memory device 500 may transmit the active command ACT and the first row address R0 to all of the row decoder (212_0, . . . , and 212_(L−1) of FIG. 11) coupled to respective banks of the banks (211_0, . . . , and 211_(L−1) of FIG. 11). As a result, first rows having the first row address R0 among the plurality of rows included in each of the banks (211_0, . . . , and 211_(L−1) of FIG. 11) may be activated. Subsequently, in the memory device 500, the first read command RD1 and the first column address C0 may be transmitted to all of the column decoders (213_0, . . . , and 213_(L−1) of FIG. 11). As a result, data of first columns selected by the first column address C0 among data of all of columns in the first rows in the banks (211_0, . . . , and 211_(L−1) of FIG. 11) may be stored into the I/O buffering part (230 of FIG. 11).

Subsequently, in the memory device 500, the first read command RD1 and the first bank address B0 may be transmitted to the I/O buffering part (230 of FIG. 11). As a result, first data DATA1 of the first columns in the first rows in the first bank (211_0 of FIG. 11) selected by the first bank address B0 among the data stored in the I/O buffering part (230 of FIG. 11) may be outputted from the I/O buffering part (230 of FIG. 11). The first data DATA1 outputted from the I/O buffering part (230 of FIG. 11) may be transmitted from the memory device 500 to the data buffer 650 of the memory controller 600 through the data I/O part 540 of the memory device 500. Like the present embodiment, when all of the read request commands REQ_Rs are signals for requesting the read operations for the same row (i.e., the first row), a pre-charge operation for the first rows having the first row address R0 may be omitted.

Next, in the memory controller 600, the third read request command REQ_R3 may be transmitted from the read queue 612 to the command/address generator 630. The command/address generator 630 may generate and output the third external command EC3 and the third external address EXT_ADDR3 to the memory device 500 in response to the third read request command REQ_R3. Like the present embodiment, when all of the read request commands REQ_Rs are signals for requesting the read operations for the same row (i.e., the first row), an active operation for the first rows having the first row address R0 may be omitted. Subsequently, in the memory device 500, the third read command RD3 and the second bank address B1 may be transmitted to the I/O buffering part (230 of FIG. 11). As a result, third data DATA3 of the first columns in the first rows in the second bank (211_1 of FIG. 11) selected by the second bank address B1 among the data stored in the I/O buffering part (230 of FIG. 11) may be outputted from the I/O buffering part (230 of FIG. 11) by the same operation as the first read operation performed by the first read request command REQ_R1. The third data DATA3 outputted from the I/O buffering part (230 of FIG. 11) may be transmitted from the memory device 500 to the data buffer 650 of the memory controller 600 through the data I/O part 540 of the memory device 500.

Next, in the memory controller 600, the fifth read request command REQ_R5 may be transmitted from the read queue 612 to the command/address generator 630. The command/address generator 630 may generate and output the fifth external command EC5 and the fifth external address EXT_ADDR5 to the memory device 500 in response to the fifth read request command REQ_R5. Subsequently, in the memory device 500, the fifth read command RD5 and the third bank address B2 may be transmitted to the I/O buffering part (230 of FIG. 11). As a result, fifth data DATA5 of the first columns in the first rows in the third bank (211_2 of FIG. 11) selected by the third bank address B2 among the data stored in the I/O buffering part (230 of FIG. 11) may be outputted from the I/O buffering part (230 of FIG. 11) by the same operation as the read operation performed by the first read request command REQ_R1 or the read operation performed by the third read request command REQ_R3. The fifth data DATA5 outputted from the I/O buffering part (230 of FIG. 11) may be transmitted from the memory device 500 to the data buffer 650 of the memory controller 600 through the data I/O part 540 of the memory device 500.

Next, in the memory controller 600, the second read request command REQ_R2 may be transmitted from the read queue 612 to the command/address generator 630. The command/address generator 630 may generate and output the second external command EC2 and the second external address EXT_ADDR2 to the memory device 500 in response to the second read request command REQ_R2. In response to the second external command EC2 and the second external address EXT_ADDR2, the memory device 500 may transmit the active command ACT and the first row address R0 to all of the row decoder (212_0, . . . , and 212_(L−1) of FIG. 11) coupled to respective banks of the banks (211_0, . . . , and 211_(L−1) of FIG. 11). As a result, the first rows having the first row address R0 among the plurality of rows included in each of the banks (211_0, . . . , and 211_(L−1) of FIG. 11) may be activated. Subsequently, as a column address of the second read request command REQ_R2 is changed as compared with the fifth read operation performed previously by the fifth read request command REQ_R5, the second read command RD2 and the fifth column address C4 may be transmitted to all of the column decoders (213_0, . . . , and 213_(L−1) of FIG. 11) in the memory device 500. As a result, data of fifth columns selected by the fifth column address C4 among data of all of columns in the first rows in the banks (211_0, . . . , and 211_(L−1) of FIG. 11) may be stored into the I/O buffering part (230 of FIG. 11).

Subsequently, in the memory device 500, the second read command RD2 and the first bank address B0 may be transmitted to the I/O buffering part (230 of FIG. 11). As a result, second data DATA2 of the fifth columns in the first rows in the first bank (211_0 of FIG. 11) selected by the first bank address B0 among the data stored in the I/O buffering part (230 of FIG. 11) may be outputted from the I/O buffering part (230 of FIG. 11). The second data DATA2 outputted from the I/O buffering part (230 of FIG. 11) may be transmitted from the memory device 500 to the data buffer 650 of the memory controller 600 through the data I/O part 540 of the memory device 500.

Next, in the memory controller 600, the fourth read request command REQ_R4 may be transmitted from the read queue 612 to the command/address generator 630. The command/address generator 630 may generate and output the fourth external command EC4 and the fourth external address EXT_ADDR4 to the memory device 500 in response to the fourth read request command REQ_R4. Subsequently, in the memory device 500, the fourth read command RD4 and the second bank address B1 may be transmitted to the I/O buffering part (230 of FIG. 11). As a result, fourth data DATA4 of the fifth columns in the first rows in the second bank (211_1 of FIG. 11) selected by the second bank address B1 among the data stored in the I/O buffering part (230 of FIG. 11) may be outputted from the I/O buffering part (230 of FIG. 11) by the same operation as the read operation performed by the second read request command REQ_R2. The fourth data DATA4 outputted from the I/O buffering part (230 of FIG. 11) may be transmitted from the memory device 500 to the data buffer 650 of the memory controller 600 through the data I/O part 540 of the memory device 500.

As such, when a schedule for a high speed operation of the memory device 500 is set in the memory controller 600, a first read operation based on the first read request command REQ_R1, a third read operation based on the third read request command REQ_R3, a fifth read operation based on the fifth read request command REQ_R5, a second read operation based on the second read request command REQ_R2, and a fourth read operation based on the fourth read request command REQ_R4 may be sequentially performed in the memory device 500. In such a case, because the first read request command REQ_R1, the third read request command REQ_R3, and the fifth read request command REQ_R5 are executed to access to the same column (i.e., the first column selected by the first column address C0), a time interval "tCCD2" required between the first, third and fifth read commands RD1, RD3, and RD5 may be less than the time interval "tCCD1" required between two read commands for accessing to two different columns. Similarly, the time interval "tCCD2" less than the time interval "tCCD1" may also be required between the second read command RD2 and the fourth read command RD4 which are executed to access to the same column (i.e., the fifth column selected by the fifth column address C4). Only the time interval "tCCD1" may be required between the fifth read command RD5 and the second read command RD2 which are executed to access to two different columns (i.e., the first column selected by the first column address C0 and the fifth column selected by the fifth column address C4). Thus, a total operation time required to execute all of the first, third, fifth, second, and fourth read request commands REQ_R1, REQ_R3, REQ_R5, REQ_R2, and REQ_R4 which are scheduled by the scheduler 640 may be reduced by a time of "(tCCD1-tCCD2)×3" as compared with a case that the first to fifth read request commands REQ_R1, REQ_R2, REQ_R3, REQ_R4, and REQ_R5 are unscheduled.

Figure 27:
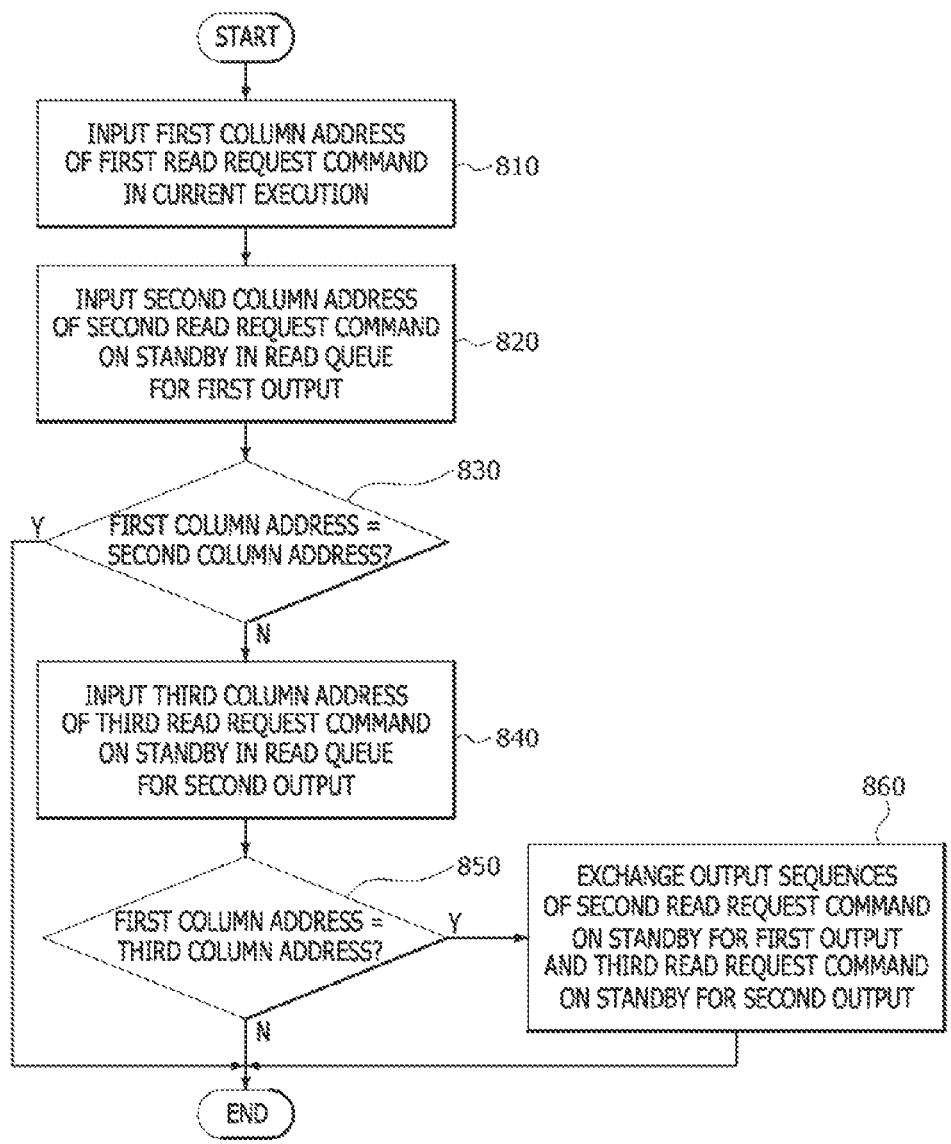
FIG. 27 is a flowchart illustrating another example of a scheduling procedure executed by a memory controller included in a memory system illustrated in FIG. 17.

FIG. 27 is a flowchart illustrating another example of a scheduling operation for a high speed operation of the memory device 500 included in the memory system 400A illustrated in FIG. 17. In the present embodiment, it may be assumed that all of the read request commands stored in the read queue 612 generate the same row address, as described with reference to FIGS. 25 and 26. In another embodiment, when at least two of the read request commands stored in the read queue 612 generate different row addresses, the same operation as described with reference to FIG. 22 may be performed in advance.

Referring to FIGS. 17 and 27, a first column address of a first read request command in current execution among read request commands stored in the read queue 612 may be inputted to the scheduler 640 (see a step 810). The first read request command in current execution may be replaced with a read request command on standby firstly in the read queue 612. After the first column address of the first read request command is inputted to the scheduler 640 at the step 810, a second column address of a second read request command on standby for a first output among the read request commands stored in the read queue 612 may be inputted to the scheduler 640 (see a step 820). The scheduler 640 may compare the second column address with the first column address to determine whether the second column address is the same as the first column address (see a step 830).

If the second column address is the same as the first column address at the step 830, an original sequence that the second read request command is outputted from the read queue 612 may be maintained. In contrast, if the second column address is different from the first column address at the step 830, a third column address of a third read request command on standby for a second output among the read request commands stored in the read queue 612 may be inputted to the scheduler 640 (see a step 840). The scheduler 640 may compare the third column address with the first column address to determine whether the third column address is the same as the first column address (see a step 850). If the third column address is different from the first column address at the step 850, the scheduling operation may terminate to maintain an original output sequence of the third read request command. In contrast, if the third column address is the same as the first column address at the step 850, the scheduler 640 may exchange output sequences of the second read request command and the third read request command which are stored in the read queue 612 (see a step 860). Thus, the first and third read request commands selecting the same column may be successively executed.

According to the various embodiments described above, a time interval required between read operations may be reduced by a scheduling operation of row addresses and/or column addresses. As a result, it may be possible to perform a high speed operation of a memory device.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A memory device comprising:
a memory area configured to store data;
a data input/output (I/O) part configured to receive and output data through an external bus;
an I/O buffering part coupled between the memory area and the data I/O part, the I/O buffering part configured to store data outputted from the memory area; and
a first internal data transmission line providing a data transmission path between the memory area and the I/O buffering part and having a first bandwidth which is greater than a bandwidth of the external bus,
wherein data transmission between the memory area and the I/O buffering part through the first internal data transmission line is executed using a portion of the first bandwidth in a first operation mode and is executed using all of the first bandwidth in a second operation mode,
wherein the memory area includes a plurality of matrices,
wherein each of the plurality of matrices includes a memory cell array having a plurality of memory cells respectively disposed at cross points of a plurality of rows and a plurality of columns and a sense/amplification circuit having input lines and output lines, and
wherein the sense/amplification circuit is configured to receive data of all columns in a selected row designated by a row address among the plurality of rows in response to an active command in the first operation mode and the second operation mode, is configured to output data of a selected column designated by a column address among the plurality of columns in response to a read command in the first operation mode, and is configured to output data of all columns in the selected row in response to the read command in the second operation mode.

2. The memory device of claim 1, further comprising:
a row decoder configured to receive the active command and the row address to activate the selected row designated by the row address; and
a column decoder configured to receive the read command and the column address to activate the selected column designated by the column address in the first operation mode and configured to receive the read command to activate all columns in the selected row in the second operation mode.

3. The memory device of claim 1,
wherein the memory area is configured to output data of a selected column designated by a column address among data of all columns in a selected row designated by a row address through the first internal data transmission line in the first operation mode; and
wherein the memory area is configured to output the data of all columns in the selected row designated by the row address through the first internal data transmission line in the second operation mode.

4. The memory device of claim 3,
wherein the memory area includes "K" matrices (where, "K" is a natural number equal to or greater than two);
wherein each of the "K" matrices has "M" rows and "N" columns intersecting the "M" rows (where, "M" is a natural number equal to or greater than two, and "N" is a natural number equal to or greater than two);
wherein the first bandwidth of the first internal data transmission line is "K×N" bits;
wherein only "K" bits of the first internal data transmission line are used in the first operation mode, and all of the "K×N" bits of the first internal data transmission line are used in the second operation mode.

5. The memory device of claim 1,
wherein the memory area includes "K" matrices (where, "K" is a natural number equal to or greater than two);
wherein each of the matrices has "M" rows and "N" columns intersecting the "M" rows (where, "M" is a natural number equal to or greater than two, and "N" is a natural number equal to or greater than two); and
wherein the I/O buffering part includes:
a plurality of buffer memories configured to store data outputted from the plurality of matrices, respectively; and
a selection/output part configured to receive data outputted from the plurality of buffer memories and to sequentially output the data which are outputted from the plurality of buffer memories.

6. The memory device of claim 5,
wherein each of the plurality of buffer memories is configured to receive and store 1-bit data outputted from one of the plurality of matrices in the first operation mode and is configured to receive and store "N"-bit data outputted from one of the plurality of matrices in the second operation mode;
wherein the plurality of buffer memories are configured to output "K"-bit data in the first operation mode and are configured to output "K×N"-bit data in the second operation mode.

7. The memory device of claim 6, wherein the plurality of buffer memories are configured to receive data in parallel and to output the data in parallel.

8. The memory device of claim 6,
wherein the selection/output part includes a plurality of input terminals corresponding to respective buffer memories of the plurality of buffer memories; and
wherein each of the plurality of input terminals includes "N"-number of sub-input terminals corresponding to respective columns of the "N" columns.

9. The memory device of claim 8,
wherein the selection/output part is configured to receive a first mode selection control signal in the first operation mode and to receive a second mode selection control signal and a column address in the second operation mode;
wherein the selection/output part is configured to sequentially output a plurality of 1-bit data, which are inputted to the plurality of input terminals, in response to the first mode selection control signal; and
wherein the selection/output part is configured to output data, which is inputted to a sub-input terminal corresponding to a selected column designated by the column address among the "N" sub-input terminals included in each of the plurality of input terminals, in response to the second mode selection control signal.

10. The memory device of claim 1, wherein the bandwidth of the external bus is the same as the number of bits of the first internal data transmission line used in the first operation mode.

* * * * *